(12) United States Patent
Ozeki et al.

(10) Patent No.: US 11,126,052 B2
(45) Date of Patent: Sep. 21, 2021

(54) ARRAY SUBSTRATE, METHOD FOR MANUFACTURING THE SAME, DISPLAY DEVICE, AND SWITCHING ELEMENT

(71) Applicant: Japan Display Inc., Tokyo (JP)

(72) Inventors: Yoshitaka Ozeki, Tokyo (JP); Gen Koide, Tokyo (JP); Nobutaka Ozaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/227,078

(22) Filed: Dec. 20, 2018

(65) Prior Publication Data

US 2019/0198674 A1 Jun. 27, 2019

(30) Foreign Application Priority Data

Dec. 27, 2017 (JP) .............................. JP2017-252080

(51) Int. Cl.
| | |
|---|---|
| *G02F 1/1362* | (2006.01) |
| *G02F 1/1368* | (2006.01) |
| *H01L 29/786* | (2006.01) |
| *H01L 29/66* | (2006.01) |
| *H01L 27/32* | (2006.01) |

(52) U.S. Cl.
CPC ...... *G02F 1/1368* (2013.01); *G02F 1/136209* (2013.01); *H01L 29/66765* (2013.01); *H01L 29/78633* (2013.01); *H01L 29/78678* (2013.01); *H01L 27/3272* (2013.01)

(58) Field of Classification Search
CPC ......... H01L 29/78633; H01L 29/66765; H01L 27/124; H01L 27/3272; G02F 1/136209; G02F 1/1368
See application file for complete search history.

(56) References Cited

U.S. PATENT DOCUMENTS

| | | | | |
|---|---|---|---|---|
| 6,420,758 B1* | 7/2002 | Nakajima | ........... | H01L 29/4908 257/350 |
| 2006/0292726 A1* | 12/2006 | Akimoto | ........... | H01L 21/02672 438/30 |
| 2008/0142804 A1* | 6/2008 | Oh | ...................... | G02F 1/13454 257/59 |

(Continued)

FOREIGN PATENT DOCUMENTS

JP 2015-206819 A 11/2015

*Primary Examiner* — Thanh Nhan P Nguyen
(74) *Attorney, Agent, or Firm* — K&L Gates LLP

(57) ABSTRACT

According to an aspect, an array substrate includes: a substrate; a light-shielding layer; a first gate electrode; a semiconductor layer; a signal line; and an electrode. A first surface of the substrate is provided with, in sequence, the light-shielding layer, the first gate electrode, the semiconductor layer, the signal line, and the electrode. The semiconductor layer includes a first impurity region electrically coupled to the electrode, a first channel region overlapping the first gate electrode, a second impurity region opposite to the first impurity region with respect to the first channel region, and a first lightly doped drain region between the first impurity region and the first channel region. The light-shielding layer has a first end and a second end opposite to each other. The first end overlaps the first channel region. The light-shielding layer overlaps a boundary between the first channel region and the first lightly doped drain region.

22 Claims, 15 Drawing Sheets

(56) References Cited

U.S. PATENT DOCUMENTS

| | | | |
|---|---|---|---|
| 2015/0279868 A1* | 10/2015 | Park | G02F 1/136204 257/72 |
| 2015/0301378 A1* | 10/2015 | Ishii | H01L 29/78633 349/110 |
| 2015/0362805 A1* | 12/2015 | Nakagawa | H01L 29/78633 257/71 |
| 2018/0224683 A1* | 8/2018 | Liu | H01L 21/266 |
| 2019/0312147 A1* | 10/2019 | Lee | H01L 29/78618 |

* cited by examiner

ARRAY SUBSTRATE, METHOD FOR MANUFACTURING THE SAME, DISPLAY DEVICE, AND SWITCHING ELEMENT

CROSS-REFERENCE TO RELATED APPLICATIONS

This application claims priority from Japanese Application No. 2017-252080, filed on Dec. 27, 2017, the contents of which are incorporated by reference herein in its entirety.

BACKGROUND

1. Technical Field

The present disclosure relates to an array substrate, a method for manufacturing the same, a display device, and a switching element.

2. Description of the Related Art

Japanese Patent Application Laid-open Publication No. 2015-206819 (JP-A-2015-206819) describes an active matrix display device that includes thin film transistors. JP-A-2015-206819 describes thin film transistors that have a top gate structure. In the top gate structure, a semiconductor layer is provided between an insulating substrate and a gate electrode. The thin film transistors described in JP-A-2015-206819 are each provided with a light-shielding layer that is located such that it overlaps the channel region of the semiconductor layer in order to suppress any leakage current. In thin film transistors that have a bottom gate structure, a gate electrode is provided between the insulating substrate and a semiconductor layer. Thin film transistors with this structure that includes a bottom gate structure suppress any leakage current caused by external light or light from an illumination device, such as a backlight.

If the amount of light from the illumination device increases, however, it is necessary to take into account the possibility of the generation of a leakage current even in thin film transistors that have a bottom gate structure. JP-A-2015-206819 does not describe a thin film transistor that has a bottom gate structure.

SUMMARY

According to an aspect, an array substrate includes: a substrate; a light-shielding layer; a first gate electrode; a semiconductor layer; a signal line; and an electrode. A first surface of the substrate is provided with, in sequence, the light-shielding layer, the first gate electrode, the semiconductor layer, the signal line, and the electrode. The semiconductor layer includes a first impurity region electrically coupled to the electrode, a first channel region overlapping the first gate electrode in planar view, a second impurity region opposite to the first impurity region with respect to the first channel region, and a first lightly doped drain region provided between the first impurity region and the first channel region. The light-shielding layer has a first end and a second end opposite to the first end. The first end is disposed at a position overlapping the first channel region, and the light-shielding layer overlaps a boundary between the first channel region and the first lightly doped drain region.

According to another aspect, a method for manufacturing an array substrate including a substrate having a first surface provided with, in sequence, a light-shielding layer, a first gate electrode, a semiconductor layer, a signal line, and an electrode, includes: providing the substrate to which the light-shielding layer, the first gate electrode, and the semiconductor layer are provided such that a first end of the light-shielding layer overlaps the first gate electrode and a second end opposite to the first end does not overlap the first gate electrode in planar view; forming a resist layer on the semiconductor layer and performing back-surface exposure of exposing the resist layer from a side of a second surface opposite to the first surface of the substrate with the light-shielding layer and the first gate electrode functioning as a mask for the resist layer; and performing front-surface exposure of exposing the resist layer from a side of the first surface of the substrate with a mask provided facing the resist layer.

According to still another aspect, a display device includes: a substrate; a light-shielding layer; a first gate electrode; a semiconductor layer; a signal line; a pixel electrode; a common electrode; and a display functional layer. A first surface of the substrate is provided with, in sequence, the light-shielding layer, the first gate electrode, the semiconductor layer, the signal line, the pixel electrode, and the display functional layer, and the common electrode is opposed to the pixel electrode. The semiconductor layer includes a first impurity region electrically coupled to the pixel electrode, a first channel region overlapping the first gate electrode in planar view, a second impurity region opposite to the first impurity region with respect to the first channel region, and a first lightly doped drain region provided between the first impurity region and the first channel region. The light-shielding layer has a first end and a second end opposite to the first end. The first end is disposed at a position overlapping the first channel region, and the light-shielding layer overlaps a boundary between the first channel region and the first lightly doped drain region.

According to still another aspect, a switching element includes: a substrate; a light-shielding layer; a first gate electrode; a semiconductor layer; a signal line; and an electrode. A first surface of the substrate is provided with, in sequence, the light-shielding layer, the first gate electrode, the semiconductor layer, the signal line, and the electrode. The semiconductor layer includes a first impurity region electrically coupled to the electrode, a first channel region overlapping the first gate electrode in planar view, a second impurity region opposite to the first impurity region with respect to the first channel region, and a first lightly doped drain region provided between the first impurity region and the first channel region. The light-shielding layer has a first end and a second end opposite to the first end. The first end is disposed at a position overlapping the first channel region, and the light-shielding layer overlaps a boundary between the first channel region and the first lightly doped drain region.

DETAILED DESCRIPTION

Figure 1:
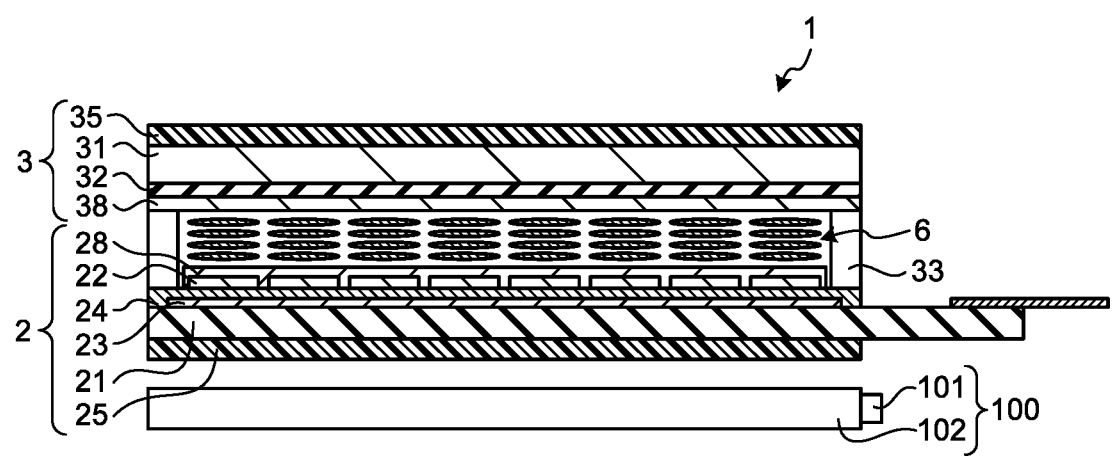
FIG. 1 is a schematic diagram illustrating a sectional structure of a display device according to a first embodiment of the present disclosure.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is an example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are examples only and are not intended to limit interpretation of the present disclosure. In the present specification and the figures, components similar to those previously described with reference to previous figures are denoted by the same reference numerals, and detailed explanation thereof may be appropriately omitted.

In this disclosure, when an element is described as being "on" another element, the element can be directly on the other element, or there can be one or more elements between the element and the other element.

First Embodiment

Figure 2:
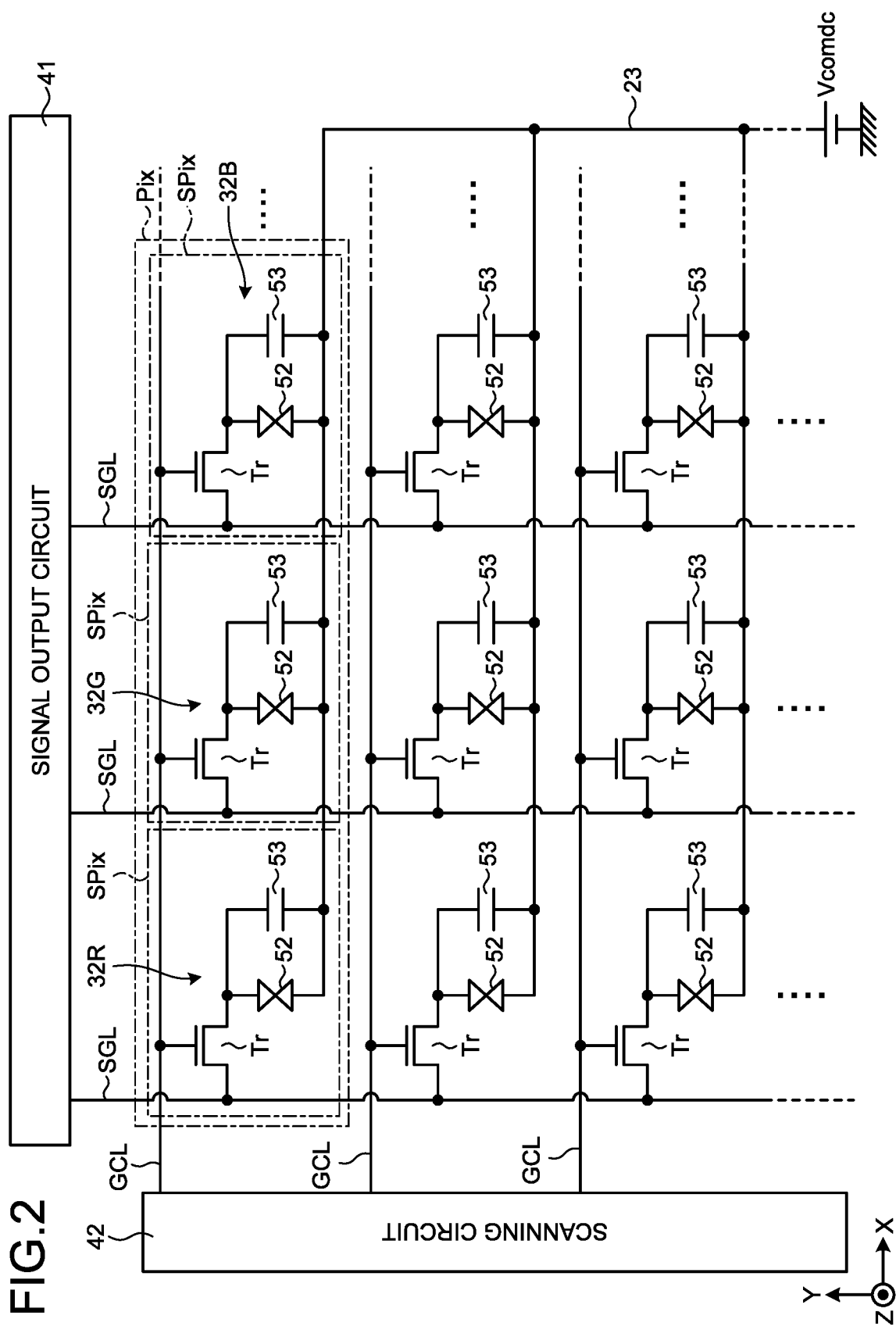
FIG. 2 is a circuit diagram illustrating an example of an array of pixels provided in the display device according to the present embodiment.

FIG. 1 is a schematic diagram illustrating a sectional structure of a display device according to a first embodiment of the present disclosure. FIG. 2 is a circuit diagram illustrating an example of an array of pixels provided in the display device according to the present embodiment. A display device 1 according to the present embodiment is a transmissive liquid crystal display device. Examples of electronic apparatuses provided with the display device 1 include, but are not limited to, smartphones and other portable electronic apparatuses. Alternatively, the display device 1 may be applied to onboard display devices, such as head-up displays (HUD).

As illustrated in FIG. 1, the display device 1 includes an array substrate 2, a counter substrate 3, and a liquid crystal layer 6 serving as a display functional layer. The counter substrate 3 is disposed facing the array substrate 2 in a direction perpendicular to the surface of the array substrate 2. The liquid crystal layer 6 is provided between the array substrate 2 and the counter substrate 3.

The array substrate 2 includes a first substrate 21, pixel electrodes 22, a common electrode 23, an insulating layer 24, a polarizing plate 25, and an orientation film 28. The first substrate 21 is provided with various circuits, switching elements Tr, such as thin film transistors (TFTs), and various kinds of wiring (not illustrated in FIG. 1), such as gate lines GCL and signal lines SGL.

The common electrode 23 is provided on the upper side of the first substrate 21. The pixel electrodes 22 are provided on the upper side of the common electrode 23 with the insulating layer 24 interposed therebetween. The pixel electrodes 22 are provided in a layer different from that of the common electrode 23 and disposed overlapping the common electrode 23 in planar view. The pixel electrodes 22 are disposed in a matrix (row-column configuration) in planar view. The orientation film 28 is provided on the upper side of the pixel electrodes 22. The polarizing plate 25 is provided on the lower side of the first substrate 21. The pixel electrodes 22 and the common electrode 23 are made of a translucent conductive material, such as indium tin oxide (ITO). While the pixel electrodes 22 according to the present embodiment are provided on the upper side of the common electrode 23, for example, the common electrode 23 may be provided on the upper side of the pixel electrodes 22.

In the description of the display device 1, the "upper side" indicates a direction from the first substrate 21 toward a second substrate 31 in the direction perpendicular to the surface of the first substrate 21, and the "lower side" indicates a direction from the second substrate 31 toward the first substrate 21. The "planar view" indicates a view seen in the direction perpendicular to the surface of the first substrate 21.

The counter substrate 3 includes the second substrate 31, a color filter 32, an orientation film 38, and a polarizing plate 35. The color filer 32 is provided on one surface of the second substrate 31. The orientation film 38 is provided on the lower side of the color filter 32. The polarizing plate 35 is provided on the other surface of the second substrate 31.

The first substrate 21 and the second substrate 31 are disposed facing each other with a predetermined gap formed by a sealing part 33 interposed therebetween. The liquid crystal layer 6 is provided in the space surrounded by the first substrate 21, the second substrate 31, and the sealing part 33. The liquid crystal layer 6 modulates light passing therethrough depending on the state of an electric field. The liquid crystal layer 6, for example, includes liquid crystals in a horizontal electric field mode, such as the in-plane switching (IPS) mode including the fringe field switching (FFS) mode. The liquid crystal layer 6 according to the present embodiment is driven by a horizontal electric field generated between the pixel electrodes 22 and the common electrode 23.

An illumination device 100 is provided on the lower side of the array substrate 2. The illumination device 100 includes a light source 101 and a light guide plate 102. The illumination device 100 according to the present embodiment is an edge-light backlight. In other words, the light guide plate 102 faces the first substrate 21. The light source 101 is a light emitting diode (LED), for example, and is provided on an end of the light guide plate 102. Light emitted from the light source 101 is turned into planar light through the light guide plate 102. The illumination device 100 provides the planar light to the first substrate 21. The light provided by the illumination device 100 passes through the array substrate 2 and is modulated depending on the state of the liquid crystals at the corresponding position. The state of light transmission to a display surface varies depending on the positions. With this mechanism, a display image is displayed on the display surface.

The illumination device 100 is not limited to an edge-light backlight and may be a direct backlight. In the direct backlight, the light source 101 is provided directly under the light guide plate 102. Alternatively, the display device 1 may be a reflective display device that performs display by reflecting external light. In this case, the display device 1 does not necessarily include the illumination device 100 or may include a front light.

The display device 1 illustrated in FIG. 1 is a horizontal-electric-field liquid crystal display device. The display device 1 is not limited thereto and may be a vertical-electric-field liquid crystal display device. In this case, the common electrode 23 is provided in the counter substrate 3. In the vertical-electric-field liquid crystal display device, the liquid crystal layer 6 is driven by what is called a vertical electric field generated between the pixel electrodes 22 and the common electrode 23. Examples of the modes of the vertical-electric-field liquid crystal layer 6 include, but are not limited to, the twisted nematic (TN) mode, the vertical alignment (VA) mode, the electrically controlled birefringence (ECB) mode, etc.

As illustrated in FIG. 2, the array substrate 2 (refer to FIG. 1) is provided with the switching elements Tr and wiring, such as the signal lines SGL and the gate lines GCL. The switching elements Tr are provided corresponding to sub-pixels SPix. The signal lines SGL are wiring that supplies pixel signals to the pixel electrodes 22. The gate lines GCL are wiring that supplies drive signals for driving the switching elements Tr. The gate lines GCL and the signal lines SGL intersect each other. The sections defined by the gate lines GCL and the signal lines SGL are arrayed in a matrix (row-column configuration). One section corresponds to a region provided with one sub-pixel SPix.

The display device 1 includes a plurality of sub-pixels SPix arrayed in a matrix (row-column configuration). The sub-pixels SPix each include the switching element Tr and a liquid crystal element 52. The switching element Tr is a thin film transistor and is an n-channel metal oxide semiconductor (MOS) TFT in this example. As illustrated in FIG. 1, the insulating layer 24 is provided between the pixel electrodes 22 and the common electrode 23, thereby forming holding capacitance 53 illustrated in FIG. 2.

The gate lines GCL are coupled to a scanning circuit 42. The scanning circuit 42 sequentially selects each of the gate lines GCL. The scanning circuit 42 applies a scanning signal to each of the gates of the switching elements Tr via the selected gate line GCL. As a result, one row (one horizontal line) out of the sub-pixels SPix is selected as an object of display drive. The signal lines SGL are coupled to a signal output circuit 41. The signal output circuit 41 supplies the pixel signals to the sub-pixels SPix included in the selected horizontal line via the signal lines SGL. The display device 1 thus performs display in units of one horizontal line.

To perform the display operation, a display drive signal Vcomdc is applied to the common electrode 23. As a result, the common electrode 23 serves as an electrode that supply a common potential to the pixels Pix.

Color areas 32R, 32G, and 32B in three colors of R, G, and B, for example, serve as a set. Each of the color areas 32R, 32G, and 32B corresponds to its respective sub-pixel SPix illustrated in FIG. 2. In the present embodiment, a set of sub-pixels SPix corresponding to the color areas 32R, 32G, and 32B in the three colors serves as one pixel Pix. The number and the combination of colors of the sub-pixels SPix serving as one pixel Pix are examples only. The number and the combination of colors are not limited thereto and may be appropriately modified. The sub-pixels SPix serving as one pixel Pix may include a white sub-pixel SPix, for example.

Figure 3:
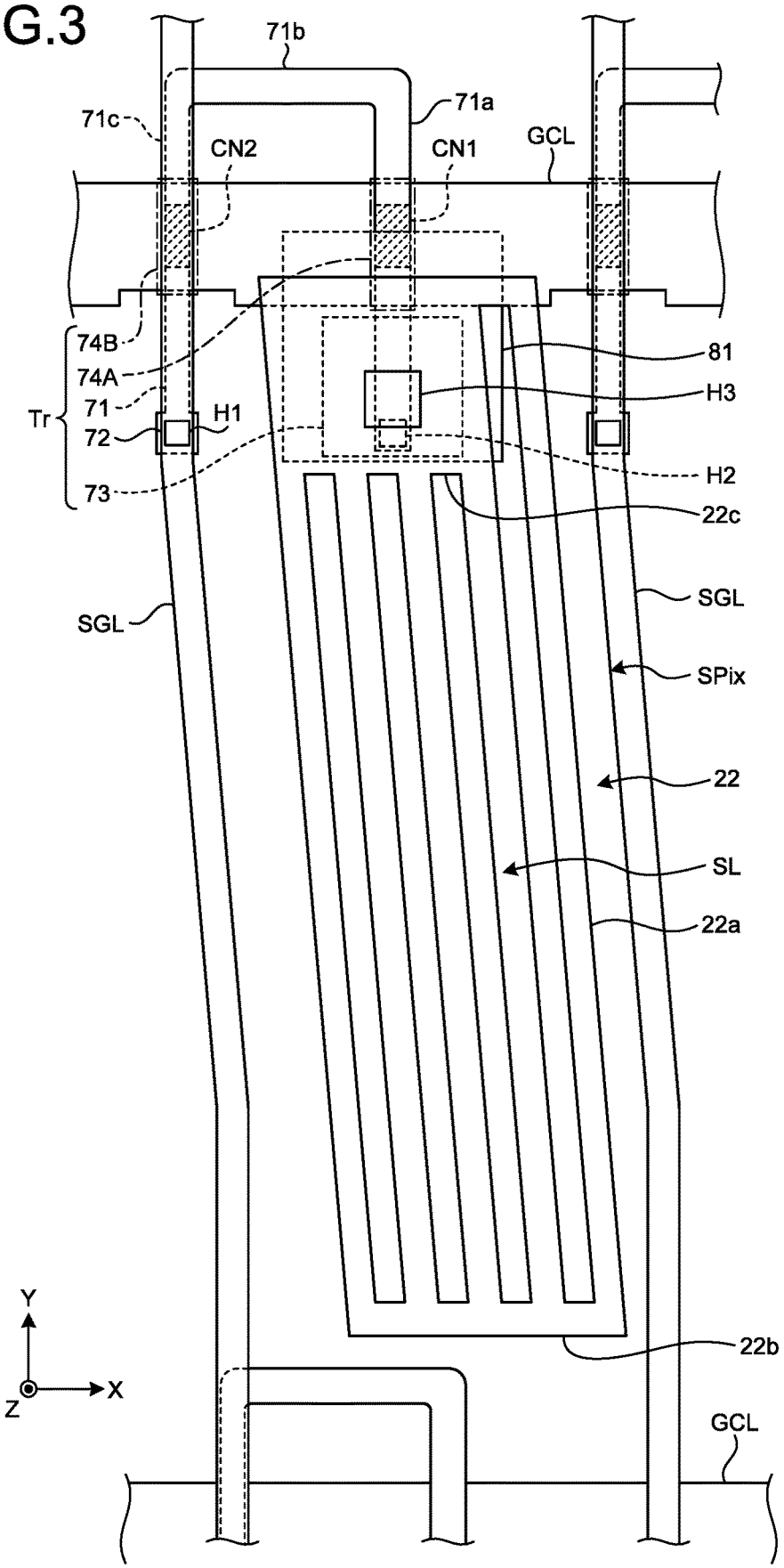
FIG. 3 is a plan view schematically illustrating the structure of a sub-pixel.

FIG. 3 is a plan view schematically illustrating the structure of the sub-pixel. FIG. 3 illustrates the structure of one sub-pixel SPix. To simplify the drawing, FIG. 3 does not illustrate the common electrode 23.

As illustrated in FIG. 3, the display device 1 includes light-shielding layers 81, the switching elements Tr, the gate lines GCL, the signal lines SGL, and the pixel electrodes 22. The gate lines GCL are arrayed in a Y-direction and extend in an X-direction. The signal lines SGL are arrayed in the X-direction and extend in the Y-direction. The pixel electrodes 22 are each provided in a region surrounded by the gate lines GCL and the signal lines SGL.

The X-direction is a direction in a plane parallel to the first substrate 21 and is parallel to the gate lines GCL, for example. The Y-direction is another direction in the plane parallel to the first substrate 21 and is orthogonal to the X-direction. A Z-direction is orthogonal to the X-direction and the Y-direction. The Y-direction may intersect the X-direction not at right angles.

The pixel electrode 22 includes a plurality of strip electrodes 22a, a first connection 22b, and a second connection 22c. The strip electrodes 22a are arrayed in the X-direction with slits SL interposed therebetween and provided along the signal lines SGL. The first connection 22b connects first ends of the strip electrodes 22a. The second connection 22c connects second ends of the strip electrodes 22a. The second connection 22c has a width (length in the Y-direction) greater than that of the first connection 22b. The second connection 22c is electrically coupled to a drain electrode 73 of the switching element Tr through a contact hole H3.

The pixel electrode 22 illustrated in FIG. 3 is only an example and may have another structure. The number of strip electrodes 22a may be four or less or six or more. The pixel electrode 22, for example, does not necessarily have the slits SL and may have a plate shape. The strip electrode 22a does not necessarily have a linear shape and may have one or more bends.

The switching element Tr is provided at or near an intersection of the gate line GCL and the signal line SGL. The switching element Tr includes a semiconductor layer 71, a source electrode 72, the drain electrode 73, a first gate electrode 74A, and a second gate electrode 74B. The semiconductor layer 71 is made of low-temperature polycrystalline silicon (LTPS).

The switching element Tr made of LTPS is manufactured by depositing amorphous silicon (a-Si) on an insulating substrate, such as a glass substrate, and poly-crystallizing the a-Si by excimer laser annealing (ELA), for example. The switching element Tr made of LTPS can be manufactured at a process temperature of equal to or lower than 600° C. Consequently, the drive circuit that drives the liquid crystals, such as the signal output circuit 41 and the scanning circuit 42 (refer to FIG. 2), can be formed simultaneously on the same substrate as that of the switching element Tr. LTPS has higher carrier mobility than that of a-Si. Consequently, the display device 1 requires a smaller switching element Tr, thereby increasing the aperture ratio of the pixels (sub-pixels SPix).

The semiconductor layer 71 includes a first partial semiconductor layer 71a, a second partial semiconductor layer 71b, and a third partial semiconductor layer 71c. The first partial semiconductor layer 71a is provided along the Y-direction and intersects the gate line GCL in planar view. A first end of the first partial semiconductor layer 71a is coupled to the drain electrode 73 through a contact hole H2. A first channel region CN1 is disposed at part of the first partial semiconductor layer 71a, which overlaps the gate line GCL.

The third partial semiconductor layer 71c is provided along the signal line SGL. The third partial semiconductor layer 71c overlaps the signal line SGL and intersects the gate line GCL in planar view. The third partial semiconductor layer 71c is disposed adjacent to the first partial semiconductor layer 71a in the X-direction. A first end of the third partial semiconductor layer 71c is coupled to the source electrode 72 through a contact hole H1. The source electrode 72 is part of the signal line SGL. A second channel region CN2 is disposed at part of the third partial semiconductor layer 71c, which overlaps the gate line GCL.

The second partial semiconductor layer 71b is provided along the X-direction and couples a second end of the first partial semiconductor layer 71a and a second end of the third partial semiconductor layer 71c. With this structure, a first end of the semiconductor layer 71 is electrically coupled to the pixel electrode 22 via the drain electrode 73. A second end of the semiconductor layer 71 is electrically coupled to the signal line SGL.

The switching element Tr according to the present embodiment has what is called a double gate structure including a first gate electrode 74A and a second gate electrode 74B. Both of the first gate electrode 74A and the second gate electrode 74B are part of the gate line GCL. The first gate electrode 74A is a part of the gate line GCL that overlaps the first partial semiconductor layer 71a. The second gate electrode 74B is a part of the gate line GCL that overlaps the third partial semiconductor layer 71c.

The light-shielding layer 81 overlaps part of the semiconductor layer 71. Specifically, the light-shielding layer 81 overlaps part of the first channel region CN1 of the first partial semiconductor layer 71a on the side of the first channel region CN1 that is closer to the pixel electrode 22. The light-shielding layer 81 also overlaps the drain electrode 73, part of the pixel electrode 22, and part of the gate line GCL. The light-shielding layer 81 is made of a metal material, such as molybdenum (Mo), tungsten (W), aluminum (Al), titanium (Ti), and silver (Ag).

Figure 4:
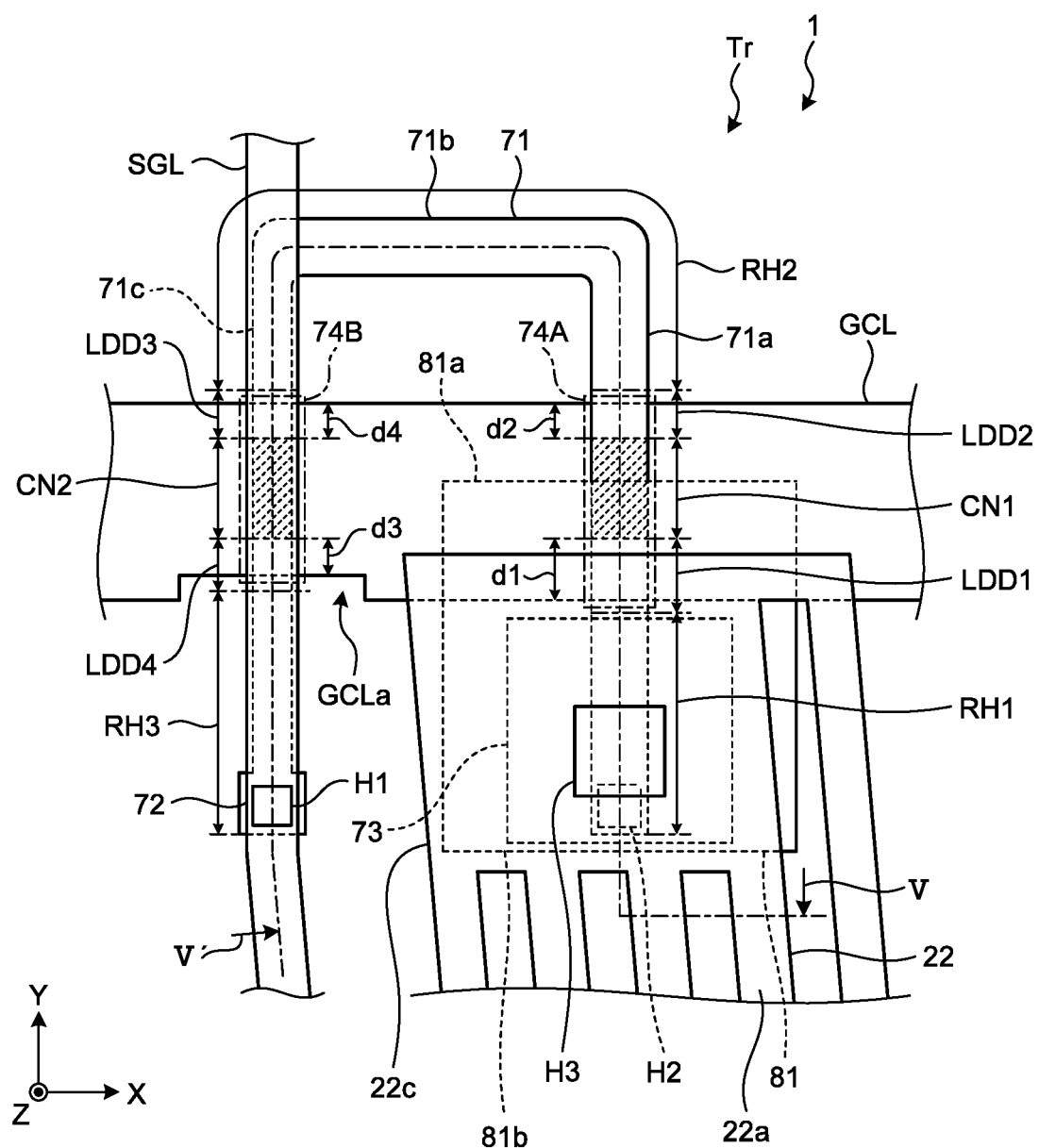
FIG. 4 is a plan view schematically illustrating the structure of a switching element provided in the display device according to the present embodiment.
Figure 5:
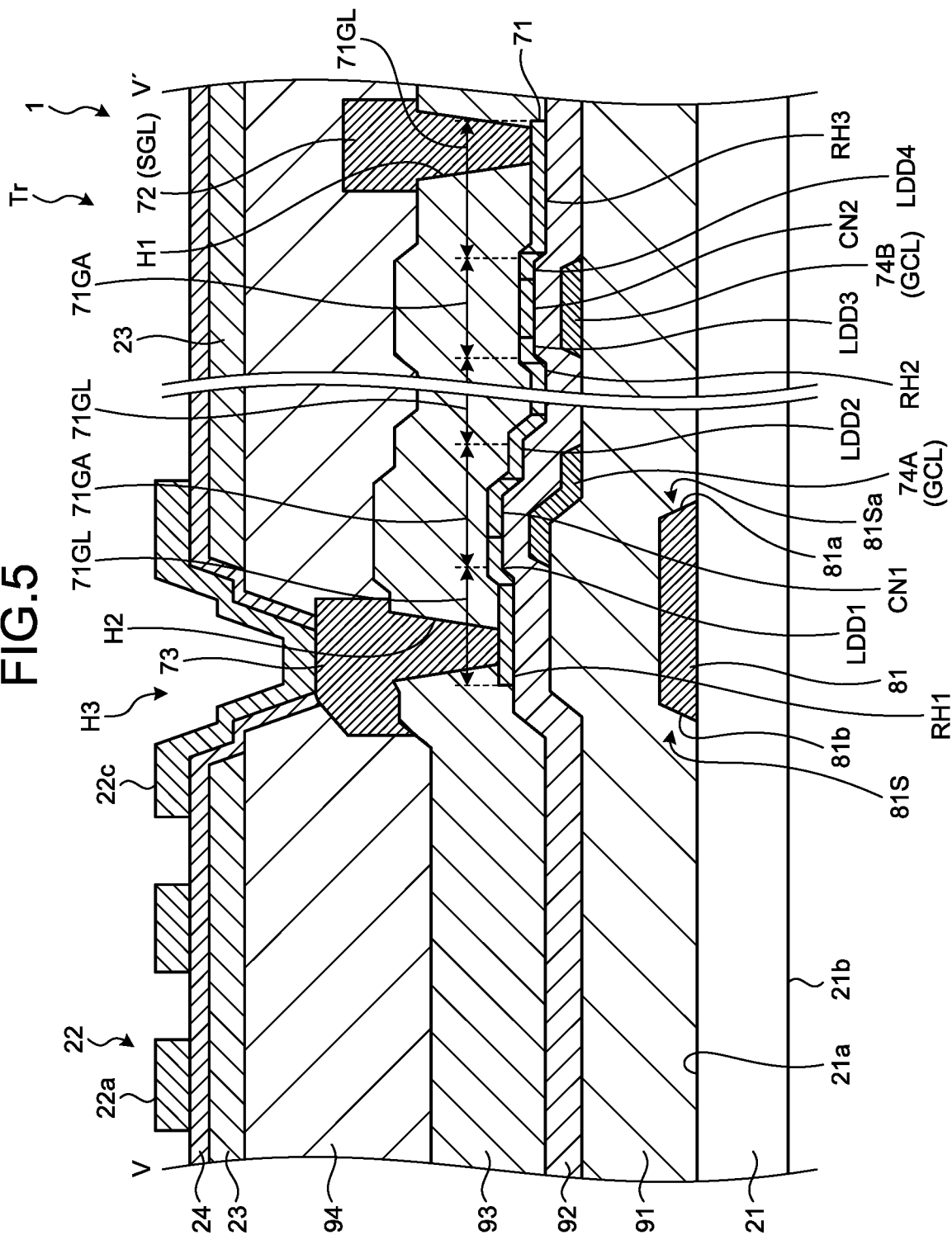
FIG. 5 is a sectional view along line V-V of FIG. 4.

The following describes the structure of the switching element Tr and the light-shielding layer 81 in greater detail with reference to FIGS. 4 and 5. FIG. 4 is a plan view schematically illustrating the structure of a switching element provided in the display device according to the present embodiment. FIG. 5 is a sectional view along line V-V of FIG. 4.

As illustrated in FIG. 4, the semiconductor layer 71 includes a first impurity region RH1, a first lightly doped drain (LDD) region LDD1, the first channel region CN1, a second lightly doped drain region LDD2, a second impurity region RH2, a third lightly doped drain region LDD3, the second channel region CN2, a fourth lightly doped drain region LDD4, and a third impurity region RH3. In the following description, the first impurity region RH1, the second impurity region RH2, and the third impurity region RH3 may be referred to as impurity regions RH when they need not be distinguished from one another. The first lightly doped drain region LDD1, the second lightly doped drain region LDD2, the third lightly doped drain region LDD3, and the fourth lightly doped drain region LDD4 may be referred to as lightly doped drain regions LDD when they need not be distinguished from one another.

The impurity regions RH and the lightly doped drain regions LDD are regions where an impurity, such as phosphorus (Pt), is implanted into the semiconductor layer 71. The lightly doped drain regions LDD have an impurity concentration lower than that of the impurity regions RH.

The first impurity region RH1, the first lightly doped drain region LDD1, the first channel region CN1, the second lightly doped drain region LDD2, the second impurity region RH2, the third lightly doped drain region LDD3, the second channel region CN2, the fourth lightly doped drain region LDD4, and the third impurity region RH3 are provided in this order from the first end to the second end of the semiconductor layer 71.

Specifically, the first channel region CN1 is a part of the semiconductor layer 71 that overlaps the first gate electrode 74A (gate line GCL) in planar view. The second channel region CN2 is a part of the semiconductor layer 71 that overlaps the second gate electrode 74B (gate line GCL) in planar view.

The first impurity region RH1 is provided between the pixel electrode 22 and the first channel region CN1. The first impurity region RH1 is electrically coupled to the pixel electrode 22 via the contact hole H2, the drain electrode 73, and the contact hole H3. The second impurity region RH2 is provided opposite to the first impurity region RH1 with respect to the first channel region CN1. The second impurity region RH2 is provided between the first channel region CN1 and the second channel region CN2. The third impurity region RH3 is provided opposite to the second impurity region RH2 with respect to the second channel region CN2. The third impurity region RH3 is electrically coupled to the source electrode 72 through the contact hole H1.

The first impurity region RH1 is positioned at a first end (end closer to the pixel electrode 22) of the switching element Tr. The third impurity region RH3 is positioned at a second end (end closer to the signal line SGL) of the switching element Tr. The second impurity region RH2 is positioned between the first impurity region RH1 and the third impurity region RH3. The gate line GCL is provided between the second impurity region RH2 and the first impurity region RH1 and between the second impurity region RH2 and the third impurity region RH3 in planar view.

The first lightly doped drain region LDD1 is provided between the first impurity region RH1 and the first channel region CN1. The second lightly doped drain region LDD2 is provided between the first channel region CN1 and the second impurity region RH2. The third lightly doped drain region LDD3 is provided between the second impurity region RH2 and the second channel region CN2. The fourth lightly doped drain region LDD4 is provided between the second channel region CN2 and the third impurity region RH3. At least part of each of the lightly doped drain regions LDD overlaps the gate line GCL.

The light-shielding layer 81 has a first end 81a and a second end 81b opposite to the first end 81a. The first end 81a and the second end 81b are provided along the X-direction. The first end 81a is disposed at a position overlapping the first channel region CN1. In the Y-direction, the second end 81b is disposed at a position farther away from the first channel region CN1 than one end of the first impurity region RH1, the one end being disposed on the farthest side of the first impurity region from the first channel portion. In other words, in the Y-direction, the second end 81b overlaps the pixel electrode 22 and does not overlap the semiconductor layer 71. That is, in Y-direction, the first impurity region RH1 is disposed between the second end 81b and an end of the first channel region CN1 on the side of the first channel region CN1 that is closer to the pixel electrode 22. In other words, the second end 81b is provided at a position not overlapping the first impurity region RH1. As a result, the light-shielding layer 81 overlaps at least the boundary between the first channel region CN1 and the first lightly doped drain region LDD1. Specifically, the light-shielding layer 81 overlaps part of the first channel region CN1 on the side of the first channel region CN1 that is closer to the pixel electrode 22, the first lightly doped drain region LDD1, and the first impurity region RH1 of the semiconductor layer 71. The light-shielding layer 81 also overlaps part of the gate line GCL and the second connection 22c of the pixel electrode 22.

While the light-shielding layer 81 has a rectangular shape in planar view, the shape is not limited thereto. The light-shielding layer 81 may have another shape, such as a polygonal, a circular, and an irregular shape.

As illustrated in FIG. 5, the light-shielding layer 81, the first gate electrode 74A and the second gate electrode 74B, the semiconductor layer 71, the source electrode 72 (signal line SGL), and the pixel electrode 22 are stacked in this order on a first surface 21a of the first substrate 21. Specifically, the light-shielding layer 81 is provided on the first surface 21a of the first substrate 21. A first insulating layer 91 is provided on the first surface 21a of the first substrate 21 to cover the light-shielding layer 81. The first gate electrode 74A and the second gate electrode 74B are provided on the first insulating layer 91. A second insulating layer 92 serving as a gate insulating layer is provided on the first gate electrode 74A and the second gate electrode 74B. In the following description, the first surface 21a of the first substrate 21 may be referred to as an upper surface. A second surface 21b of the first substrate 21 may be referred to as a lower surface.

The semiconductor layer 71 is provided on the second insulating layer 92. A third insulating layer 93 is provided on the semiconductor layer 71. The source electrode 72 (signal line SGL) and the drain electrode 73 are provided on the third insulating layer 93. The source electrode 72 (signal line SGL) is coupled to the third impurity region RH3 of the semiconductor layer 71 through the contact hole H1 formed in the third insulating layer 93. The drain electrode 73 is coupled to the first impurity region RH1 of the semiconductor layer 71 through the contact hole H2 formed in the third insulating layer 93.

A fourth insulating layer 94 is provided covering the source electrode 72 (signal line SGL). The common electrode 23, the insulating layer 24, and the pixel electrode 22 are provided on the fourth insulating layer 94. The pixel electrode 22 is coupled to the drain electrode 73 through the contact hole H3 formed in the fourth insulating layer 94 and the insulating layer 24. As a result, the pixel electrode 22 is electrically coupled to the semiconductor layer 71 via the contact hole H3, the drain electrode 73, and the contact hole H2. The drain electrode 73 serves as a relay electrode. The drain electrode 73 is provided in the same layer as the layer of the source electrode 72 (signal line SGL). The drain electrode 73 may be provided in a layer different from the layer of the source electrode 72 (signal line SGL).

The first insulating layer 91, the second insulating layer 92, and the third insulating layer 93 are inorganic insulating layers made of an oxide, such as silicon oxide ($SiO_2$), or a nitride, such as silicon nitride (SiN). The first insulating layer 91, the second insulating layer 92, and the third insulating layer 93 are not limited to single layers and may each have a multilayered structure including a plurality of insulating layers. The fourth insulating layer 94 is a planarization layer.

The switching element Tr according to the present embodiment has what is called a bottom gate structure. In other words, the first gate electrode 74A and the second gate electrode 74B (gate line GCL) are provided between the first substrate 21 and the semiconductor layer 71. With this structure, the first gate electrode 74A and the second gate electrode 74B have a function of shielding light entering into the semiconductor layer 71 from the lower surface of the first substrate 21. The light-shielding layer 81 according to the present embodiment is provided between the first substrate 21 and the first gate electrode 74A. If the amount of light from the illumination device 100 (refer to FIG. 1) increases, the light-shielding layer 81 can reduce light entering into the semiconductor layer 71. Consequently, the display device 1 can suppress any leakage current in the switching element Tr.

It is known that, when the switching element Tr having a double gate structure is illuminated with light, a leakage current generated in the first lightly doped drain region LDD1 is greater than a leakage current generated in other regions (refer to JP-A-2015-206819, for example). The light-shielding layer 81 according to the present embodiment overlaps at least part of the first channel region CN1 on the side of the first channel region CN1 that is closer to the pixel electrode 22 and the first lightly doped drain region LDD1. The light-shielding layer 81 with this structure can shield, from light, the part of the semiconductor layer 71 that significantly generates a leakage current. Consequently, the display device 1 can suppress any leakage current in the switching element Tr.

The light-shielding layer 81 does not overlap any of the second lightly doped drain region LDD2, the second impurity region RH2, the third lightly doped drain region LDD3, the second channel region CN2, the fourth lightly doped drain region LDD4, and the third impurity region RH3. With this structure, the area of the light-shielding layer 81 is made smaller than in a case where the light-shielding layer 81 overlaps the entire semiconductor layer 71. Consequently, the display device 1 can suppress any leakage current in the switching element Tr and increase the aperture ratio of the sub-pixels SPix.

As illustrated in FIG. 5, at the second end 81b, a light-shielding layer step 81S is formed between the upper surface of the light-shielding layer 81 and the first surface 21a of the first substrate 21. The light-shielding layer 81 overlaps the contact hole H2. In other words, the first impurity region RH1 and the first lightly doped drain region LDD1 overlap the light-shielding layer 81. The first impurity region RH1 is not provided at a position overlapping the light-shielding layer step 81S.

Figure 6:
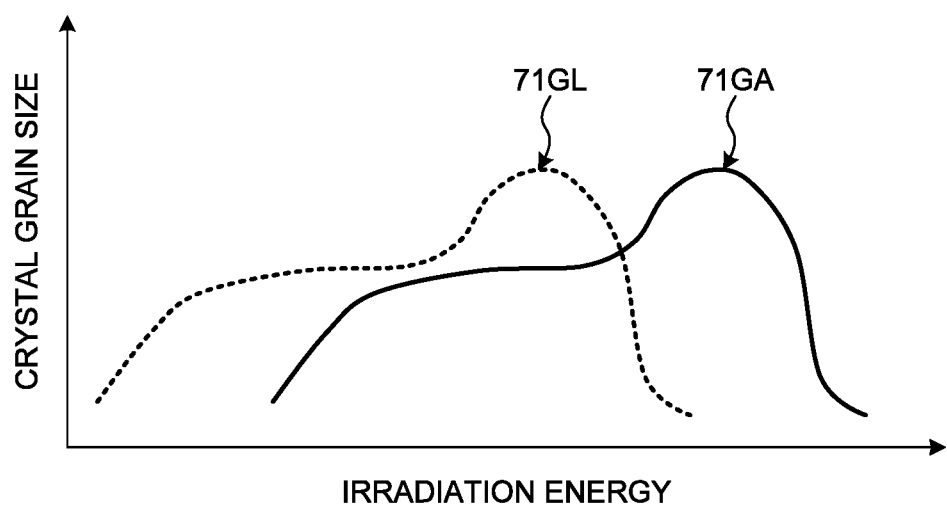
FIG. 6 is a graph schematically illustrating the relation between irradiation energy of an excimer laser and the crystal grain size of a semiconductor layer.

FIG. 6 is a graph schematically illustrating the relation between irradiation energy of an excimer laser and the crystal grain size of the semiconductor layer. As described above, the semiconductor layer 71 is poly-crystallized by ELA, for example. As illustrated in FIG. 6, the crystal grain size of the semiconductor layer 71 with respect to the same irradiation energy varies between an overlapping region 71GA and a non-overlapping region 71GL in the semiconductor layer 71. As illustrated in FIG. 5, the overlapping region 71GA corresponds to a part of the semiconductor layer 71 overlapping the first gate electrode 74A and the second gate electrode 74B (gate line GCL). The non-overlapping region 71GL corresponds to a part of the semiconductor layer 71 not overlapping the first gate electrode 74A or the second gate electrode 74B (gate line GCL).

the first gate electrode 74A and the second gate electrode 74B are made of aluminum (Al), copper (Cu), silver (Ag), molybdenum (Mo), or an alloy of these metals. The irradiation energy required for obtaining a predetermined crystal grain size in the overlapping region 71GA is larger than that required for the non-overlapping region 71GL because the overlapping region 71GA has a metal layer. ELA is performed with the irradiation energy required for the overlapping region 71GA so as to perform crystallization in the overlapping region 71GA to obtain the predetermined crystal grain size. As a result, the non-overlapping region 71GL including the first impurity region RH1 and other regions may possibly be subjected to ELA with excessive irradiation energy. If the first impurity region RH1, which is the non-overlapping region 71GL, is provided at a position overlapping the light-shielding layer step 81S illustrated in FIG. 5, the first impurity region RH1 also has a step corresponding to the light-shielding layer step 81S. In this case, if the step of the first impurity region RH1 is irradiated with an excimer laser, disconnection may possibly occur.

As illustrated in FIG. 5, the first impurity region RH1 is provided at a position not overlapping the light-shielding layer step 81S. With this structure, the switching element Tr can prevent or reduce disconnection of the semiconductor layer 71. Furthermore, at least at the first end 81a, a light-shielding layer step 81Sa is formed between the upper surface of the light-shielding layer 81 and the first surface 21a of the first substrate 21. The first gate electrode 74A and the first channel region CN1 overlap the light-shielding layer step 81Sa. The first gate electrode 74A and the first channel region CN1 each have a step corresponding to the light-shielding layer step 81Sa. The overlapping region 71GA including the first channel region CN1 is subjected to ELA with appropriate irradiation energy. Consequently, the switching element Tr can prevent or reduce disconnection of the semiconductor layer 71 caused by the light-shielding layer step 81S and 81Sa.

As illustrated in FIG. 4, a distance d1 is the distance in the Y-direction between a first side of the gate line GCL overlapping the light-shielding layer 81 and the first channel region CN1. A distance d2 is the distance in the Y-direction between a second side of the gate line GCL not overlapping the light-shielding layer 81 and the first channel region CN1. The distance d2 is shorter than the distance d1. The position of the boundary between the first channel region CN1 and the second lightly doped drain region LDD2 is defined by what is called self-alignment using the gate line GCL as a mask. Specifically, a resist is patterned by performing exposure from the lower surface of the first substrate 21 by photolithography using the gate line GCL as a mask. This processing defines the position of the boundary between the first channel region CN1 and the second lightly doped drain region LDD2.

By contrast, the position of the boundary between the first channel region CN1 and the first lightly doped drain region LDD1 is defined by the position of a first mask 200 (refer to FIG. 15) placed on the upper surface side of the first substrate 21. It is necessary to have a margin for positioning a front mask, whereby the distance d2 is shorter than the distance d1. As a result, the display device 1 can have the gate lines GCL with a smaller width than in a case where the first channel region CN1 is formed with only a front mask without performing self-alignment. Consequently, the display device 1 can increase the aperture ratio of the sub-pixels SPix.

A recess GCLa is formed on the first side of the gate line GCL at the intersection of the gate line GCL and the signal line SGL. The width of the gate line GCL at the part provided with the second gate electrode 74B is smaller than that of the gate line GCL at the part provided with the first gate electrode 74A. A distance d3 is the distance in the Y-direction between the recess GCLa and the second channel region CN2. A distance d4 is the distance between the second side of the gate line GCL and the second channel region CN2. The distance d3 is equal to the distance d4. The position of the boundary between the second channel region CN2 and the third lightly doped drain region LDD3 and the position of the boundary between the second channel region CN2 and the fourth lightly doped drain region LDD4 are defined by what is called self-alignment using the gate line GCL as a mask. The recess GCLa is formed to define the position of the boundary between the second channel region CN2 and the fourth lightly doped drain region LDD4. The method for manufacturing the switching element Tr will be described later.

In the example illustrated in FIG. 5, the thickness of the light-shielding layer 81 is larger than that of the first gate electrode 74A and the second gate electrode 74B. The present embodiment is not limited thereto, and the thickness of the light-shielding layer 81 may be substantially equal to that of the first gate electrode 74A and the second gate electrode 74B.

Second Embodiment

Figure 7:
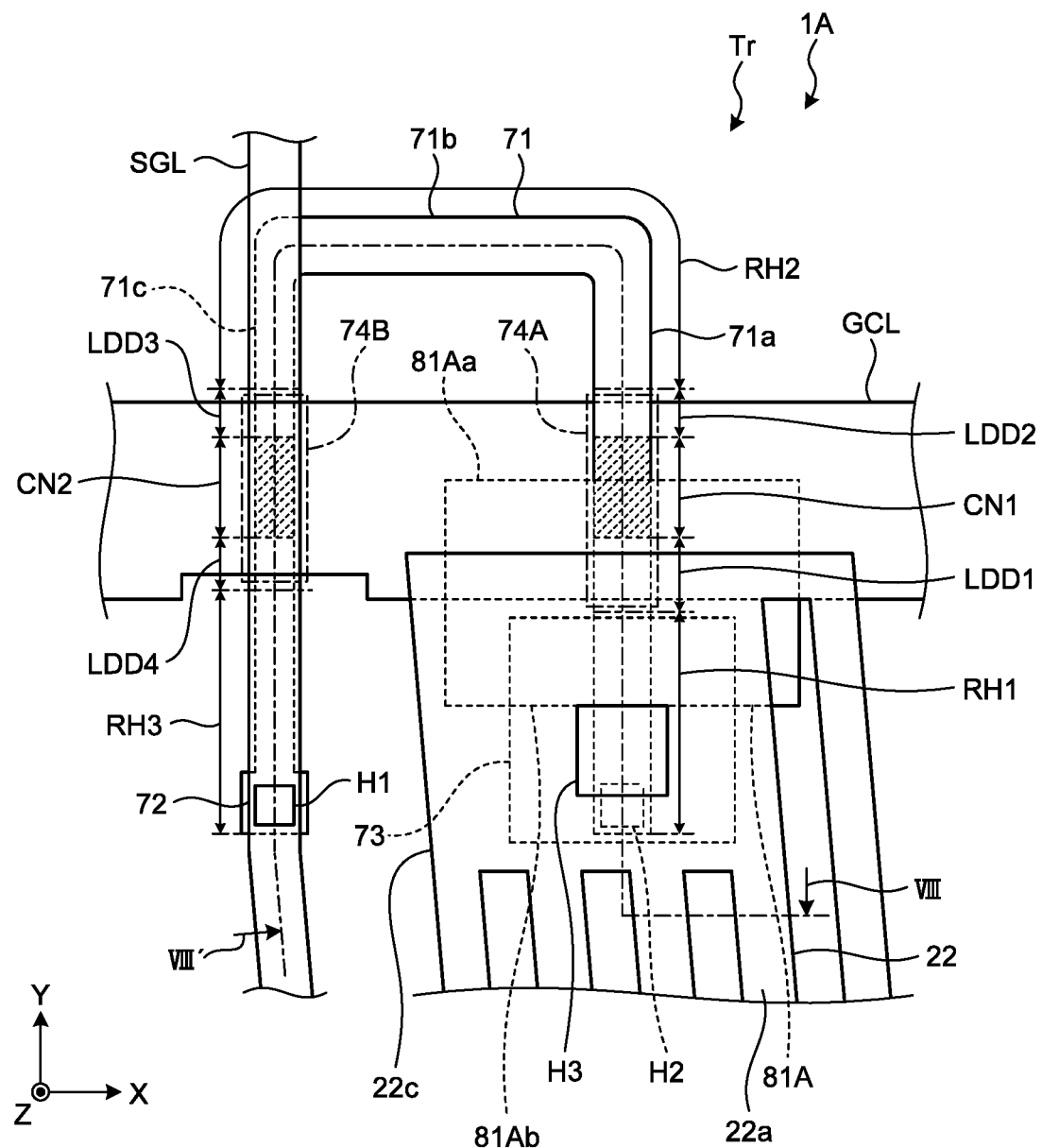
FIG. 7 is a plan view schematically illustrating the structure of a switching element provided in the display device according to a second embodiment of the present disclosure.
Figure 8:
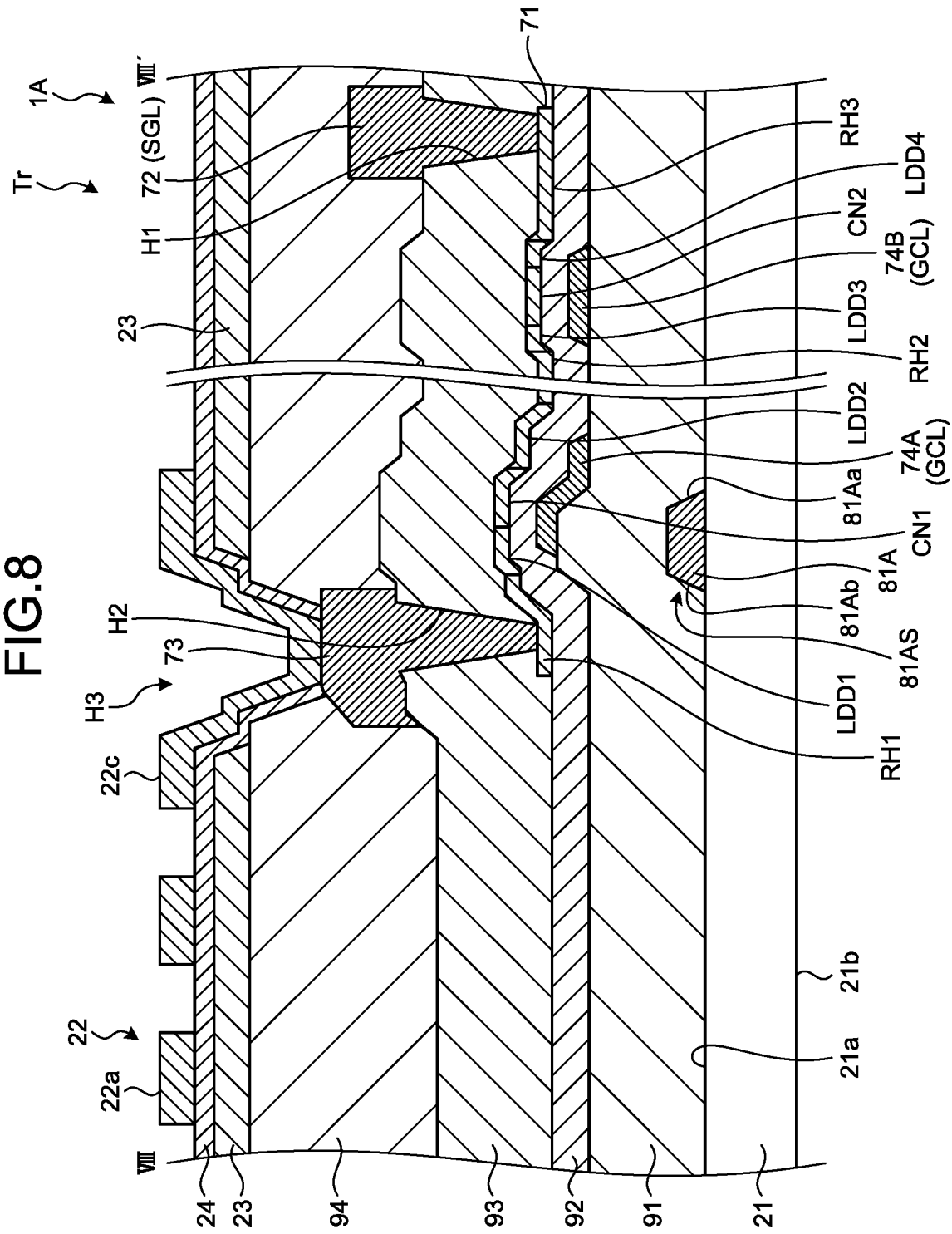
FIG. 8 is a sectional view along line VIII-VIII' of FIG. 7.

FIG. 7 is a plan view schematically illustrating the structure of a switching element provided in the display device according to a second embodiment of the present disclosure. FIG. 8 is a sectional view along line VIII-VIII' of FIG. 7. Components described in the first embodiment are denoted by the same reference numerals, and overlapping explanation thereof is omitted.

As illustrated in FIG. 7, in a display device 1A according to the present embodiment, a first end 81Aa of a light-shielding layer 81A is disposed at a position overlapping the first channel region CN1 in planar view. A second end 81Ab is provided between the contact hole H2 and the first lightly doped drain region LDD1. In other words, the second end 81Ab is disposed at a position overlapping the first impurity region RH1. As a result, the light-shielding layer 81A overlaps at least the boundary between the first channel region CN1 and the first lightly doped drain region LDD1. Specifically, the light-shielding layer 81A overlaps part of the first channel region CN1 on the side of the first channel region CN1 that is closer to the pixel electrode 22, the first lightly doped drain region LDD1, and part of the first impurity region RH1 on the side of the first impurity region RH1 that is closer to the gate line GCL of the semiconductor layer 71. The light-shielding layer 81A is disposed at a position not overlapping the contact hole H2 or the contact hole H3.

As illustrated in FIG. 8, the first impurity region RH1 is disposed at a position overlapping a light-shielding layer step 81AS formed at the second end 81Ab of the light-shielding layer 81A. The first impurity region RH1 has a step corresponding to the light-shielding layer step 81AS. The contact hole H2 is coupled to the first impurity region RH1 at a position not overlapping the step formed in the first impurity region RH1.

The area of the light-shielding layer 81A according to the present embodiment is smaller than the area according to the first embodiment. Consequently, the display device 1A can increase the aperture ratio of the sub-pixels SPix. Also in the structure according to the present embodiment, the light-shielding layer 81A overlaps the first lightly doped drain region LDD1 and the part of the first channel region CN1 on the side of the first channel region CN1 that is closer to the pixel electrode 22. Consequently, the display device 1A can suppress any leakage current in the switching element Tr.

Third Embodiment

Figure 9:
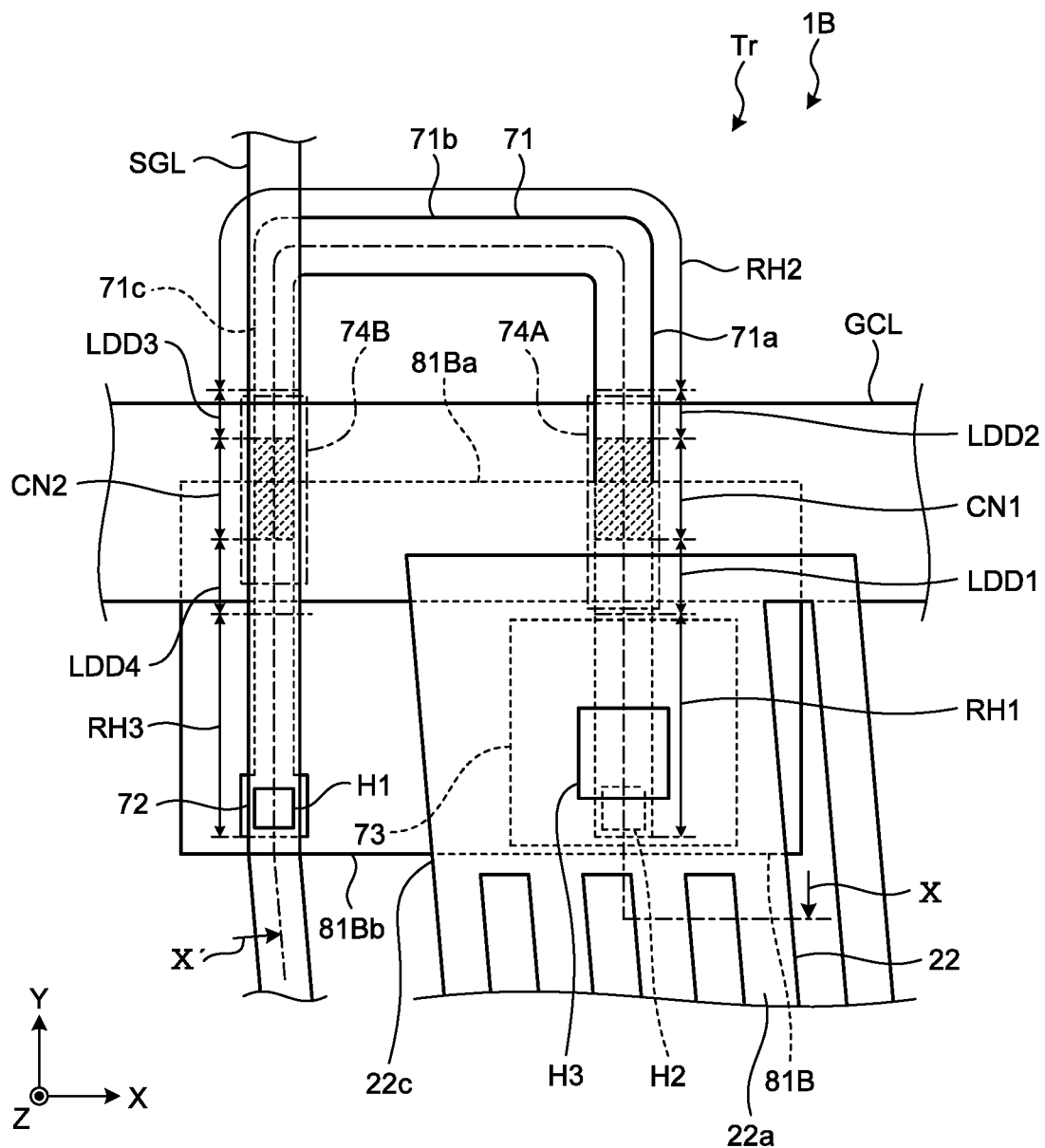
FIG. 9 is a plan view schematically illustrating the structure of a switching element provided in the display device according to a third embodiment of the present disclosure.
Figure 10:
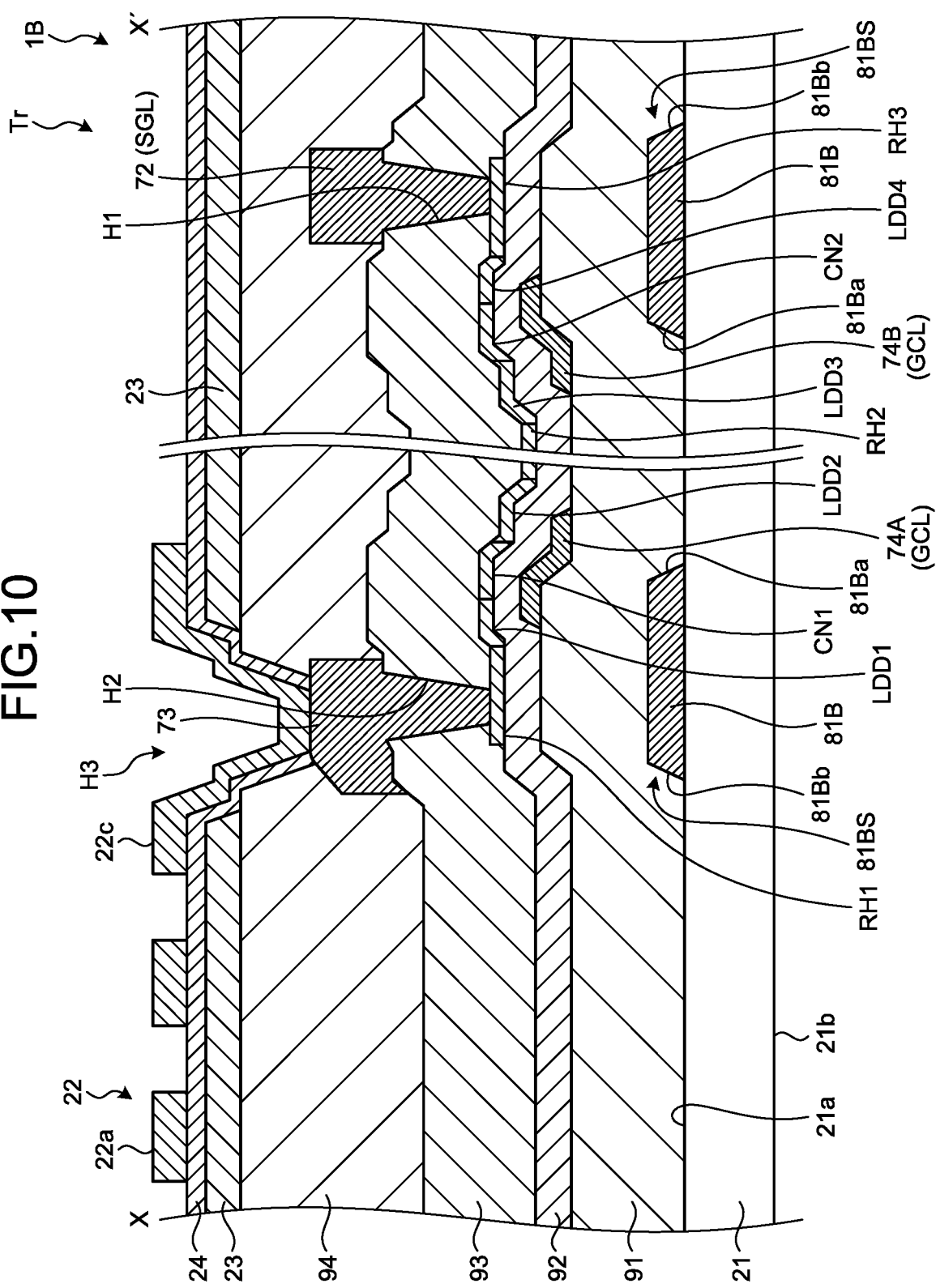
FIG. 10 is a sectional view along line X-X' of FIG. 9.

FIG. 9 is a plan view schematically illustrating the structure of a switching element provided in the display device according to a third embodiment of the present disclosure. FIG. 10 is a sectional view along line X-X' of FIG. 9. As illustrated in FIG. 9, in a display device 1B according to the present embodiment, the width of a light-shielding layer 81B in the X-direction is larger than that of the light-shielding layer 81 according to the first embodiment and the light-shielding layer 81A according to the second embodiment.

Specifically, a first end 81Ba of the light-shielding layer 81B is disposed at a position overlapping the first channel region CN1 and the second channel region CN2. In the Y-direction, a second end 81Bb is disposed at a position farther away from the first channel region CN1 than the first impurity region RH1 and farther away from the second channel region CN2 than the third impurity region RH3. As a result, the light-shielding layer 81B overlaps the boundary between the first channel region CN1 and the first lightly doped drain region LDD1. In addition, the light-shielding layer 81B overlaps the boundary between the second channel region CN2 and the fourth lightly doped drain region LDD4. The light-shielding layer 81B overlaps part of the first channel region CN1 on the side of the first channel region CN1 that is closer to the pixel electrode 22, the first lightly doped drain region LDD1, the first impurity region RH1, part of the second channel region CN2 on the side of the second channel region CN2 that is closer to the source electrode 72, the fourth lightly doped drain region LDD4, and the third impurity region RH3 of the semiconductor layer 71.

The light-shielding layer 81B with this structure can prevent external light from entering into the first lightly doped drain region LDD1 on the side of the first lightly doped drain region LDD1 that is closer to the pixel electrode 22 and the fourth lightly doped drain region LDD4 on the side of the fourth lightly doped drain region LDD4 that is closer to the signal line SGL. Consequently, the display device 1B can suppress any leakage current in the switching element Tr.

As illustrated in FIG. 10, the first impurity region RH1 is disposed at a position not overlapping a light-shielding layer step 81BS. Similarly, the third impurity region RH3 is disposed at a position not overlapping the light-shielding layer step 81BS. In other words, neither the first impurity region RH1 nor the third impurity region RH3 has a step corresponding to the light-shielding layer step 81BS. Consequently, the switching element Tr can prevent or reduce disconnection of the semiconductor layer 71.

The light-shielding layer 81B according to the present embodiment overlaps (covers) the entire first impurity region RH1 and the entire third impurity region RH3. The present embodiment is not limited thereto, and the second end 81Bb may be disposed at a position overlapping the first impurity region RH1 and the third impurity region RH3 similarly to the second embodiment. In other words, the light-shielding layer 81B may overlap the part of the first channel region CN1 on the side of the first channel region CN1 that is closer to the pixel electrode 22, the first lightly doped drain region LDD1, part of the first impurity region RH1 on the side of the first impurity region RH1 that is closer to the gate line GCL, the part of the second channel region CN2 on the side of the second channel region CN2 that is closer to the source electrode 72, the fourth lightly doped drain region LDD4, and part of the third impurity region RH3 on the side of the third impurity region RH3 that is closer to the gate line GCL of the semiconductor layer 71. In this case, the display device 1B can suppress any leakage current in the switching element Tr and increase the aperture ratio of the sub-pixels SPix.

Fourth Embodiment

Figure 11:
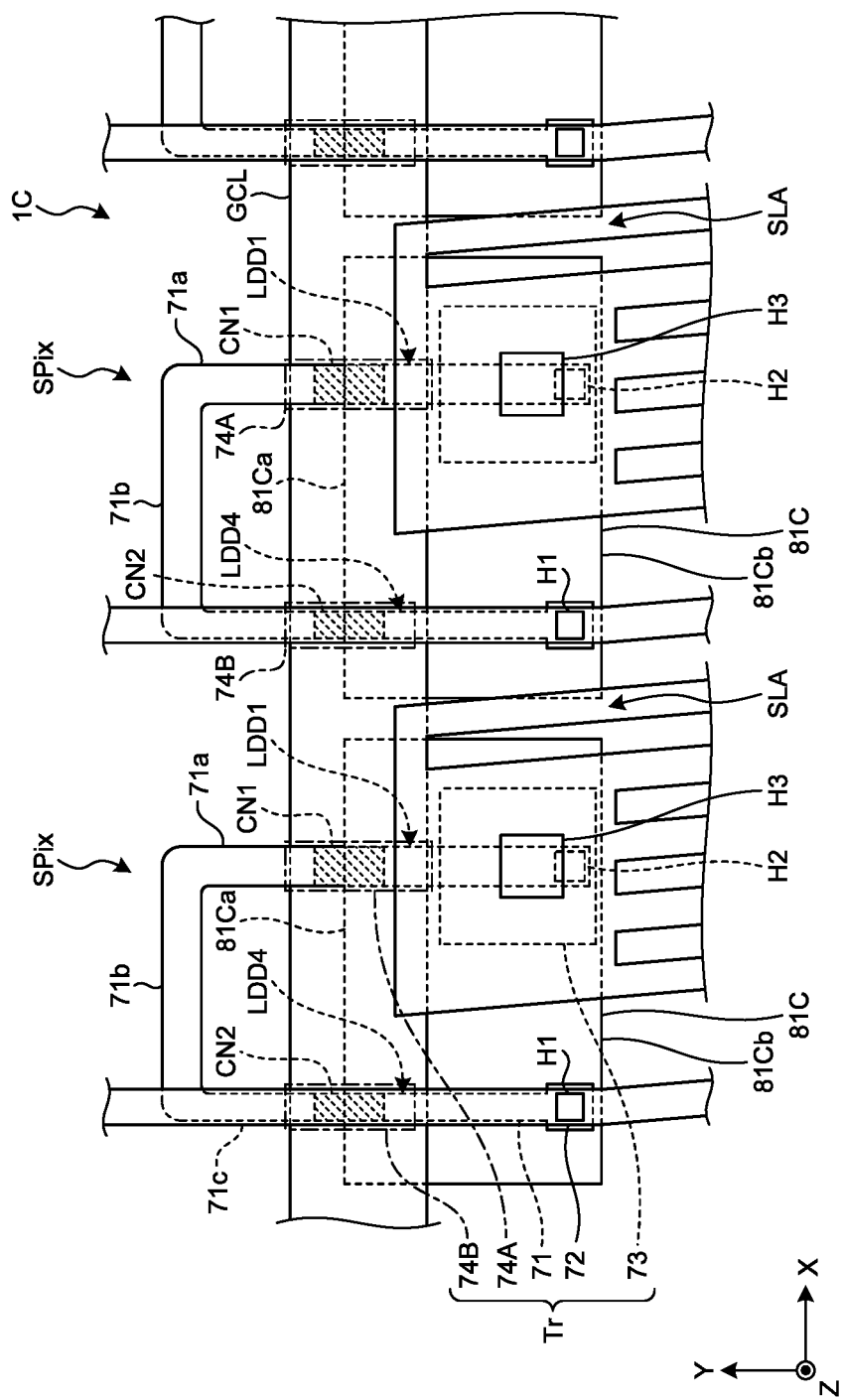
FIG. 11 is a plan view schematically illustrating the structure of a switching element provided in the display device according to a fourth embodiment of the present disclosure.

FIG. 11 is a plan view schematically illustrating the structure of a switching element provided in the display device according to a fourth embodiment of the present disclosure. FIG. 11 illustrates a plurality of sub-pixels SPix arrayed in the X-direction. While FIG. 11 illustrates two sub-pixels SPix, the display device 1C according to the fourth embodiment includes a number of sub-pixels SPix that are arrayed in a matrix (row-column configuration) in the X-direction and the Y-direction.

As illustrated in FIG. 11, in a display device 1C, a plurality of pixel electrodes 22 are arrayed in the X-direction. The pixel electrodes 22 are each provided with a light-shielding layer 81C, the first gate electrode 74A and the second gate electrode 74B, the semiconductor layer 71, and the source electrode 72 (signal line SGL). The light-shielding layers 81C are arrayed in the X-direction in a separated manner corresponding to the pixel electrodes 22 with slits SLA interposed therebetween.

The light-shielding layers 81C are the same as the light-shielding layer 81B according to the third embodiment (refer to FIGS. 9 and 10). In each of the sub-pixels SPix, a first end 81Ca of the light-shielding layer 81C is disposed at a position overlapping the first channel region CN1 and the second channel region CN2. A second end 81Cb is disposed at a position not overlapping one end of the semiconductor layer 71 on the side of the semiconductor layer 71 that is closer to the pixel electrode in the Y-direction. The light-shielding layers 81C each overlap the boundary between the first channel region CN1 and the first lightly doped drain region LDD1 of the switching element Tr. In addition, the light-shielding layers 81C each overlap the boundary between the second channel region CN2 and the fourth lightly doped drain region LDD4. The structure of the light-shielding layer 81C is not limited thereto and may be the same as the structure of the light-shielding layer 81 according to the first embodiment or the light-shielding layer 81A according to the second embodiment.

This structure can reduce capacitance generated between the light-shielding layer 81C and various kinds of wiring (the gate lines GCL and the signal lines SGL) compared with a case where the light-shielding layer 81C is provided continuously over a plurality of pixel electrodes 22 (sub-pixels SPix). As a result, this structure can reduce disturbance in the pixel potential held in the pixel electrodes 22. Consequently, the display device 1C can provide satisfactory display quality.

Fifth Embodiment

Figure 12:
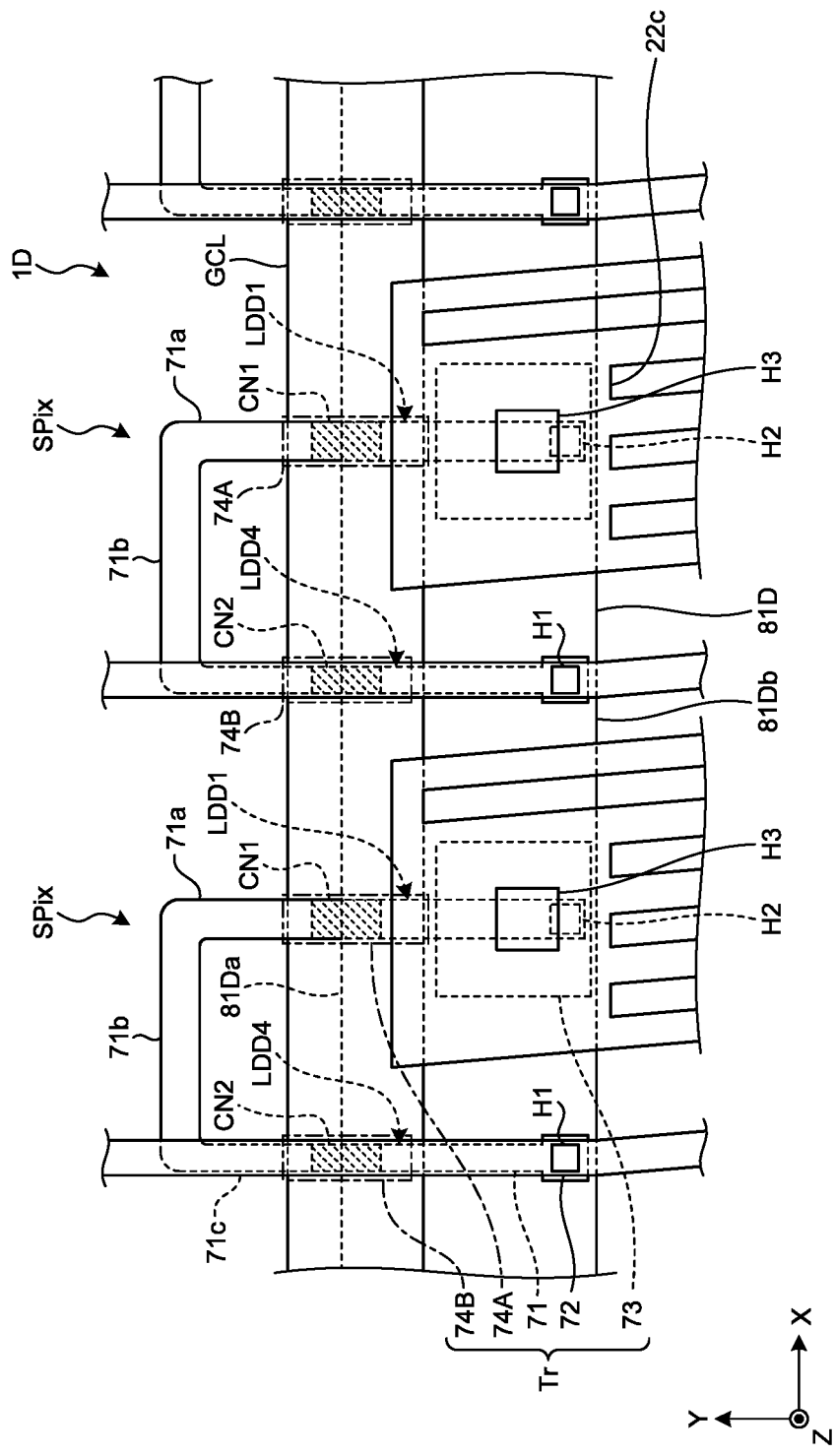
FIG. 12 is a plan view schematically illustrating the structure of a switching element provided in the display device according to a fifth embodiment of the present disclosure.

FIG. 12 is a plan view schematically illustrating the structure of a switching element provided in the display device according to a fifth embodiment of the present disclosure. As illustrated in FIG. 12, in a display device 1D, a light-shielding layer 81D is provided over a plurality of pixel electrodes 22 (sub-pixels SPix) in the X-direction. In other words, the light-shielding layer 81D is provided along the gate line GCL and intersects a plurality of signal lines SGL. A first end 81Da of the light-shielding layer 81D is disposed at a position overlapping a plurality of first channel regions CN1 and a plurality of second channel regions CN2. A second end 81Db is disposed at a position not overlapping the ends of a plurality of semiconductor layers 71 on the sides of the semiconductor layers 71 that are closer to the pixel electrodes in the Y-direction. The light-shielding layer 81D overlaps the boundaries between the first channel regions CN1 and the first lightly doped drain regions LDD1 of a plurality of switching elements Tr. In addition, the light-shielding layer 81D overlaps the boundaries between the second channel regions CN2 and the fourth lightly doped drain regions LDD4.

The display device 1D with such a configuration has less restrictions caused by the width of the light-shielding layer 81D and the width of the slit SLA (refer to FIG. 11), although the display device 1D has larger capacitance generated between the light-shielding layer 81D and the various kinds of wiring than that in the fourth embodiment. Consequently, the display device 1D can have the sub-pixels SPix with a smaller width in the X-direction, thereby performing high-definition imaging.

Method for Manufacturing the Display Device

Figure 13:
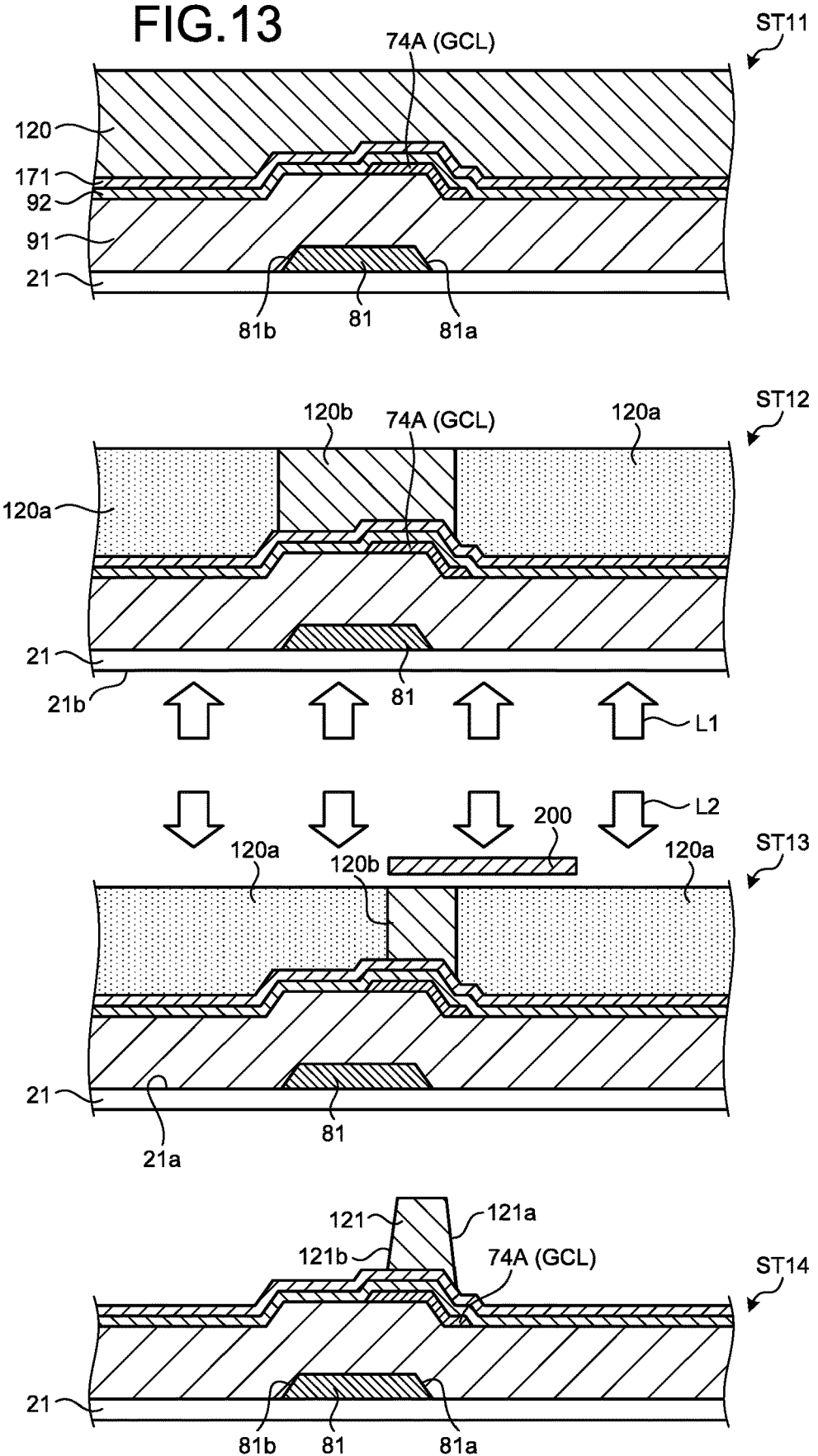
FIG. 13 is a diagram for explaining a process of forming a channel stopper layer in a method for manufacturing the display device.
Figure 14:
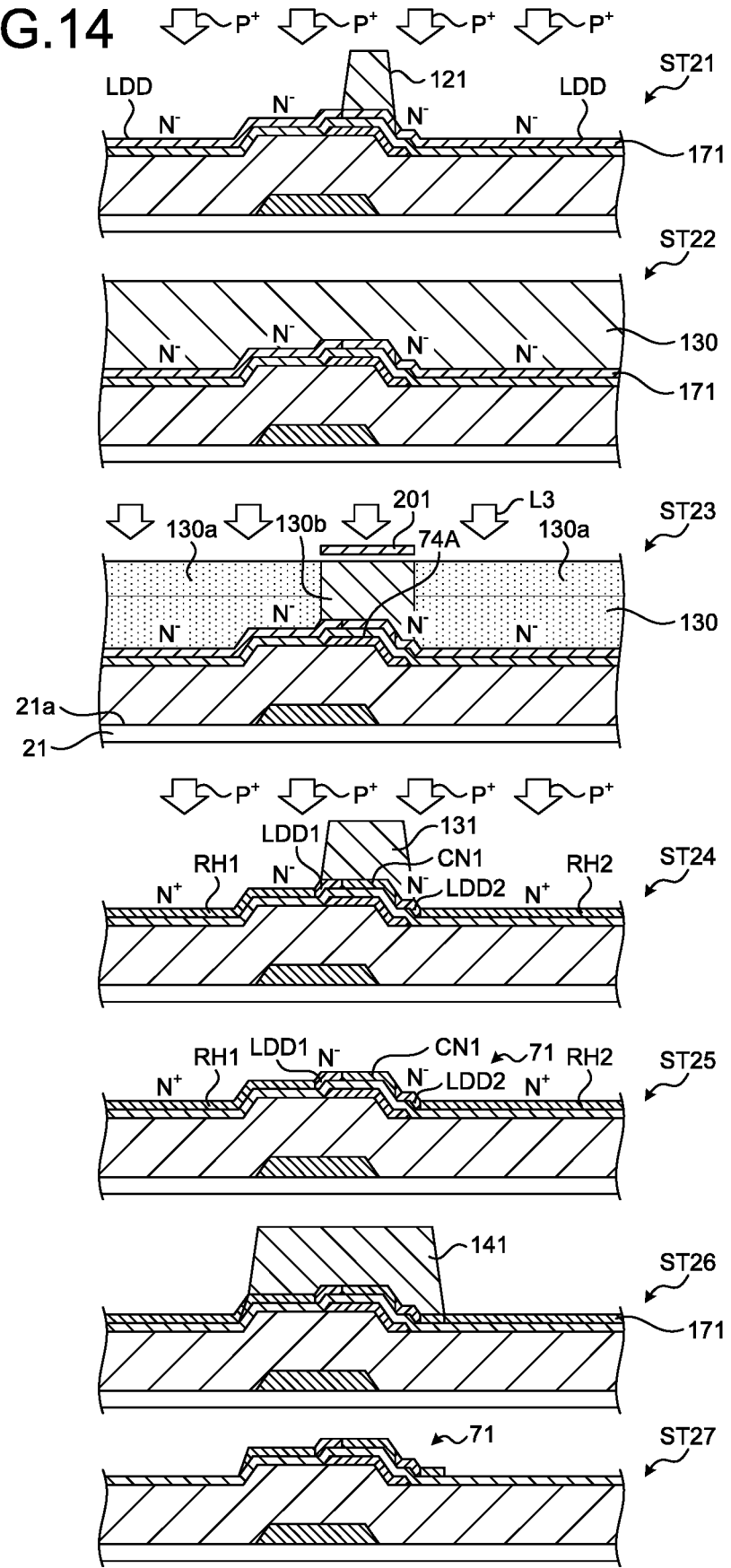
FIG. 14 is a diagram for explaining a process of forming channel regions, lightly doped drain regions, and impurity regions in the method for manufacturing the display device.
Figure 15:
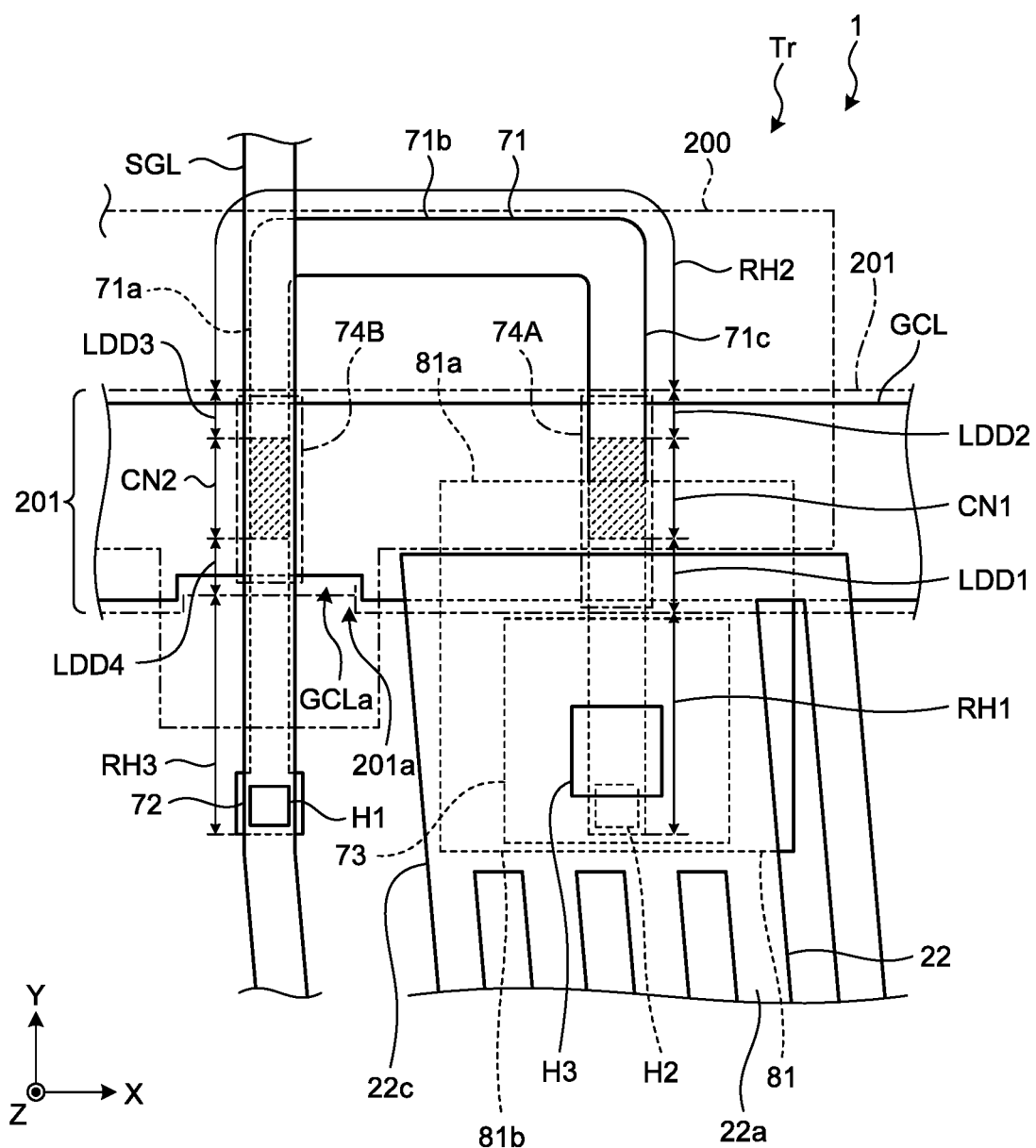
FIG. 15 is a plan view schematically illustrating the relation between the switching element, a first mask, and a second mask in the method for manufacturing the display device according to the present embodiment.

FIG. 13 is a diagram for explaining a process of forming a channel stopper layer in a method for manufacturing the display device. FIG. 14 is a diagram for explaining a process of forming the channel regions, the lightly doped drain regions, and the impurity regions in the method for manufacturing the display device. FIG. 15 is a plan view schematically illustrating the relation between the switching element, a first mask, and a second mask in the method for manufacturing the display device according to the present embodiment. To simplify the explanation, FIGS. 13 and 14 schematically illustrate a section structure near the first gate electrode 74A.

As illustrated in FIG. 13, a manufacturing apparatus (not illustrated) forms the light-shielding layer 81, the first insulating layer 91, the first gate electrode 74A (gate line GCL), the second insulating layer 92, an amorphous silicon layer 171, and a resist layer 120 in this order on the first substrate 21 (Step ST11). The light-shielding layer 81, the first insulating layer 91, the first gate electrode 74A (gate line GCL), and the second insulating layer 92 are formed by a sputtering, vapor deposition, or plasma CVD method, for example. The light-shielding layer 81 and the first gate electrode 74A (gate line GCL) are patterned by photolithography and etching. The light-shielding layer 81 and the first gate electrode 74A are patterned with the first end 81a of the light-shielding layer 81 positioned overlapping the first gate electrode 74A in planar view and with the second end 81b not positioned overlapping the first gate electrode 74A in planar view.

The amorphous silicon layer 171 is formed into the semiconductor layer 71. The amorphous silicon layer 171 is formed by plasma CVD and crystallized by excimer laser or lamp annealing or semiconductor laser annealing, for example. The resist layer 120 is made of a photosensitive resin material and applied to the entire surface of the first substrate 21.

Subsequently, exposure equipment (not illustrated) emits light L1 to the first substrate 21 from below the second surface 21b of the first substrate 21. The exposure equipment thus exposes the resist layer 120 from below the lower surface of the first substrate 21 with the light-shielding layer 81 and the first gate electrode 74A functioning as a mask (Step ST12) for the resist layer 120. As a result, an exposed region 120a and a non-exposed region 120b are formed in the resist layer 120. The exposed region 120a does not overlap the light-shielding layer 81 and the first gate electrode 74A and is irradiated with the light L1. The non-exposed region 120b overlaps the light-shielding layer 81 and the first gate electrode 74A and is not irradiated with the light L1.

Subsequently, the first mask 200 is placed on the upper side of the resist layer 120, and light L2 is emitted to the first substrate 21 from above the first surface 21a of the first substrate 21 to expose the resist layer 120 (Step ST13). The first mask 200 blocks light from reaching the part of the non-exposed region 120b formed at Step ST12 that overlaps the first gate electrode 74A. The first mask 200 does not cover the part of the non-exposed region 120b formed at Step ST12 that corresponds to the end of the first gate electrode 74A on the side of the first gate electrode 74A that is closer to the pixel electrode 22, which overlaps the light-shielding layer 81. As a result, the non-exposed region 120b is formed overlapping the first gate electrode 74A.

Subsequently, the manufacturing apparatus develops the resist layer 120 and performs baking to form a channel stopper layer 121 (Step ST14). Developing the resist layer 120 removes the exposed region 120a formed at Step ST13 and leaves the non-exposed region 120b. The non-exposed region 120b is hardened by baking and formed into the channel stopper layer 121. The channel stopper layer 121 is formed at a position overlapping the first gate electrode 74A and the first end 81a of the light-shielding layer 81.

With the process described above, the position of a first end 121a of the channel stopper layer 121 is defined by performing back-surface exposure (Step ST12) using the first gate electrode 74A (gate line GCL) as a mask, that is, by performing what is called self-alignment. The position of a second end 121b of the channel stopper layer 121 is defined by performing front-surface exposure (Step ST13) with the first mask 200.

While FIG. 13 illustrates only the section structure near the first gate electrode 74A, the channel stopper layer 121 is also formed simultaneously at the part where the second channel region CN2 is to be formed in FIG. 15. At the part where the second channel region CN2 is to be formed, the first end 121a and the second end 121b of the channel stopper layer 121 (not illustrated in FIG. 15) are defined by performing what is called self-alignment using the second gate electrode 74B (gate line GCL) as a mask.

In FIG. 15, the first mask 200 is represented by the alternate long and two short dashes line. The first mask 200 is placed overlapping regions to be formed into the second impurity region RH2, the third lightly doped drain region LDD3, the second channel region CN2, the fourth lightly doped drain region LDD4, and the third impurity region RH3. As a result, a region to be formed into the channel stopper layer 121 on the second channel region CN2 side is not exposed at Step ST13.

As illustrated in FIG. 14, the manufacturing apparatus (not illustrated) implants an impurity into the amorphous silicon layer 171 using the channel stopper layer 121 as a mask (Step ST21). The impurity is phosphorus (Pt), for example. The impurity is implanted into the amorphous silicon layer 171 by ion doping or ion implantation. As a result, the lightly doped drain region LDD is formed at part of the amorphous silicon layer 171 positioned not overlapping the channel stopper layer 121. In FIG. 14, the impurity concentration of the amorphous silicon layer 171 is represented by $N^-$ or $N^+$. The region with $N^-$ has a lower impurity concentration than that of the region with $N^+$. While the lightly doped drain regions LDD and the impurity regions RH are N-type regions, they may be P-type regions.

Subsequently, the manufacturing apparatus removes the channel stopper layer 121 and forms a resist layer 130 on the amorphous silicon layer 171 (Step ST22). The manufacturing apparatus then places a second mask 201 on the upper side of the resist layer 130 and emits light L3 to the first substrate 21 from above the upper surface of the first substrate 21 to expose the resist layer 130 (Step ST23). The second mask 201 is placed overlapping the first gate electrode 74A. As a result, an exposed region 130a and a non-exposed region 130b are formed in the resist layer 130. The exposed region 130a does not overlap the first gate electrode 74A and is irradiated with the light L3. The non-exposed region 130b overlaps the first gate electrode 74A and is shielded from the light L3 by the second mask 201.

In FIG. 15, the second mask 201 is represented by the alternate long and short dash line. The second mask 201 is placed to shield a region overlapping the gate line GCL from light. The second mask 201 has a recess 201a corresponding to the recess GCLa of the gate line GCL. The second mask 201 is placed over a region where the first channel region CN1, the first lightly doped drain region LDD1, and the second lightly doped drain region LDD2 are to be formed and a region where the second channel region CN2, the third lightly doped drain region LDD3, and the fourth lightly doped drain region LDD4 are to be formed.

Subsequently, as illustrated in FIG. 14, the manufacturing apparatus develops the resist layer 130 and performs baking to form an LDD-stopper layer 131 (Step ST24). The LDD-stopper layer 131 is formed at a position overlapping the first gate electrode 74A. The manufacturing apparatus implants an impurity into the amorphous silicon layer 171 using the LDD-stopper layer 131 as a mask. The impurity is phosphorus (Pt), for example. As a result, the first impurity region RH1 and the second impurity region RH2 are formed in a region not overlapping the LDD-stopper layer 131. At Step ST24, the impurity is not implanted into a region overlapping the LDD-stopper layer 131. As a result, the first channel region CN1, the first lightly doped drain region LDD1, and the second lightly doped drain region LDD2 are formed. The first lightly doped drain region LDD1 and the second lightly doped drain region LDD2 have a lower impurity concentration than that of the first impurity region RH1 and the second impurity region RH2.

Simultaneously with Step ST24, the manufacturing apparatus implants the impurity into the amorphous silicon layer 171 on the second channel region CN2 side illustrated in FIG. 15 using the LDD-stopper layer 131 as a mask. As a result, the second channel region CN2, the third lightly doped drain region LDD3, the fourth lightly doped drain region LDD4, and the third impurity region RH3 are formed simultaneously.

Subsequently, the manufacturing apparatus removes the LDD-stopper layer 131 (Step ST25). Subsequently, the manufacturing apparatus applies a resist layer on the amorphous silicon layer 171 and performs exposing, developing, and baking steps to form a pattern formation layer 141 (Step ST26). The pattern formation layer 141 is provided in a region where the semiconductor layer 71 is to be formed. The pattern formation layer 141 is provided overlapping the first channel region CN1, the first lightly doped drain region LDD1, and the second lightly doped drain region LDD2 and part of the first impurity region RH1 and part of the second impurity region RH2.

Subsequently, the manufacturing apparatus removes part of the amorphous silicon layer 171 not overlapping the pattern formation layer 141 by dray etching (Step ST27). The manufacturing apparatus thus patterns the semiconductor layer 71 including the first partial semiconductor layer 71a, the second partial semiconductor layer 71b, and the third partial semiconductor layer 71c (refer to FIG. 15).

Subsequently, the manufacturing apparatus forms the third insulating layer 93, the source electrode 72 (signal line SGL), the drain electrode 73, the fourth insulating layer 94, the common electrode 23, the insulating layer 24, and the pixel electrode 22 illustrated in FIG. 5 by a sputtering method, for example. The source electrode 72 (signal line SGL), the drain electrode 73, the common electrode 23, and the pixel electrode 22 are patterned by photolithography or etching, for example. With the process described above, the display device 1 including the switching elements Tr is manufactured. The manufacturing method illustrated in FIGS. 13 and 14 is an example only and may be appropriately modified.

While exemplary embodiments according to the present disclosure have been described, the embodiments are not intended to limit the disclosure. The contents disclosed in the embodiments are examples only, and various changes may be made without departing from the spirit of the present disclosure. Appropriate changes made without departing from the spirit of the present disclosure naturally fall within the scope of the disclosure. At least one of various omissions, substitutions, and changes of the components may be made without departing from the spirit of the embodiments above and modifications thereof.

The display devices 1 and 1A to 1D are liquid crystal display devices, for example, the present disclosure is also applicable to organic light emitting diode (OLED) display devices. In OLED display devices, light emitted from self-luminous elements may possibly travel in a display panel and be incident on the semiconductor layer 71. By applying the configuration described above to OLED display devices, the light-shielding layer 81 can shield, from light, the part of the semiconductor layer 71 that significantly generates a leakage current.

While the switching elements Tr and the array substrate 2 used for the display device 1 have been described, they are not necessarily used for the display device 1. The switching elements Tr and the array substrate 2 can also be used for a detection device mounted on the display surface of the display device 1. Examples of the detection device include, but are not limited thereto, a touch panel, a fingerprint sensor, etc. In this case, the first end of the semiconductor layer 71 is coupled to a detection electrode. The second end of the semiconductor layer 71 is coupled to a signal line that outputs detection signals or a signal line that supplies drive signals to the detection electrode.

What is claimed is:

1. An array substrate comprising:
    a substrate;
    a light-shielding layer;
    a first gate electrode;
    a semiconductor layer;
    a signal line;
    a pixel electrode; and
    a drain electrode in contact with the pixel electrode,
    wherein a first surface of the substrate is provided with, in sequence, the light-shielding layer, the first gate electrode, the semiconductor layer, the signal line that is in a same layer in which the drain electrode is disposed, and the pixel electrode,
    wherein the semiconductor layer includes
        a first impurity region electrically coupled to the drain electrode,
        a first channel region,
        a second impurity region opposite to the first impurity region with respect to the first channel region,
        a first lightly doped drain region provided between the first impurity region and the first channel region, in planar view, and
        a second lightly doped drain region provided between the second impurity region and the first channel region, in planar view,
    wherein the light-shielding layer has a first end and a second end opposite to the first end, the first end being disposed at a position overlapping the first channel region,
    wherein the light-shielding layer overlaps in planar view:
        a boundary between the first channel region and the first lightly doped drain region,
        an entire area of the first lightly doped drain region, and
        an entire area of the first impurity region that is electrically coupled to the drain electrode,
    wherein the light-shielding layer does not overlap in planar view:
        any part of the second lightly doped region, and
        any part of the second impurity region opposite to the first impurity region,
    wherein the first gate electrode overlaps the first channel region, the first lightly doped drain region, and the boundary between the first channel region and the first lightly doped drain region, in planar view, and
    wherein the first gate electrode is disposed between the light-shielding layer and part of the semiconductor, the part including the first channel region and the first lightly doped drain region, in a vertical direction perpendicular to the substrate.

2. The array substrate according to claim 1,
    wherein the first impurity region is coupled to the drain electrode through a contact hole formed in an insulating layer provided on the semiconductor layer, and
    wherein, in planar view, the first impurity region is disposed between the second end of the light-shielding layer and an end of the first channel region, the end of the first channel region being on the side of the first channel region that is closer to the drain electrode.

3. The array substrate according to claim 1,
    wherein the first impurity region is coupled to the drain electrode through a contact hole formed in an insulating layer provided on the semiconductor layer, and
    wherein, in planar view, the second end of the light-shielding layer is disposed at a position farther away from the first channel region than an end of the first impurity region, the end of the first impurity region being a farthest side of the first impurity region from the first channel portion.

4. The array substrate according to claim 1,
    wherein the first impurity region is coupled to the drain electrode through a contact hole formed in an insulating layer provided on the semiconductor layer, and
    wherein, in planar view, the second end of the light-shielding layer overlaps the drain electrode and does not overlap the semiconductor layer.

5. The array substrate according to claim 1,
    wherein the first impurity region is coupled to the electrode through a contact hole formed in an insulating layer provided on the semiconductor layer, and
    wherein the second end of the light-shielding layer is disposed between the drain electrode and the first lightly doped drain region in planar view.

6. The array substrate according to claim 1,
    wherein a light-shielding layer step is formed between an upper surface of the light-shielding layer and the first surface of the substrate, at least at the first end of the light shielding layer, and
    wherein the first gate electrode and the first channel region overlap the light-shielding layer step.

7. The array substrate according to claim 1, further comprising:
    a second gate electrode,
    wherein the semiconductor layer includes
        a second channel region overlapping the second gate electrode in planar view,
        a third impurity region electrically coupled to the signal line,
        a third lightly doped drain region provided between the second impurity region and the second channel region, and
        a fourth lightly doped drain region provided between the third impurity region and the second channel region.

8. The array substrate according to claim 7, further comprising:
    a gate line extending along a first direction parallel to the first surface of the substrate,
    wherein the first gate electrode and the second gate electrode are part of the gate line overlapping the semiconductor layer in planar view.

9. The array substrate according to claim 8,
    wherein the width of the gate line at a part provided with the second gate electrode is smaller than the width of the gate line at a part provided with the first gate electrode.

10. The array substrate according to claim 7,
    wherein the first end of the light-shielding layer is disposed at a position overlapping the first channel region and the second channel region, and
    wherein the light-shielding layer overlaps the boundary between the first channel region and the first lightly doped drain region and a boundary between the second channel region and the fourth lightly doped drain region, in planar view.

11. The array substrate according to claim 1, further comprising:
    a plurality of the pixel electrodes arrayed in a first direction parallel to the first surface of the substrate, wherein the light-shielding layer, the first gate electrode, the semiconductor layer, and the signal line are provided for each of the pixel electrodes, and wherein a plurality of the light-shielding layers are arrayed in a separated manner corresponding to the pixel electrodes.

12. The array substrate according to claim 1, further comprising:
a plurality of the pixel electrodes arrayed in a first direction parallel to the first surface of the substrate,
wherein the first gate electrode, the semiconductor layer, and the signal line are provided for each of the pixel electrodes, and
wherein the light-shielding layer is provided over the drain electrodes along the first direction.

13. The array substrate according to claim 1,
wherein the semiconductor layer is made of low-temperature polycrystalline silicon.

14. The array substrate according to claim 13, wherein the light-shielding layer partially overlaps the semiconductor layer which is a single layer consisting of low-temperature polycrystalline silicon, in such a manner that the light-shielding layer overlaps in planar view:
the boundary between the first channel region and the first lightly doped drain region,
the entire area of the first lightly doped drain region, and
the first impurity region coupled directly to the drain electrode.

15. The array substrate according to claim 1, wherein the light-shielding layer is overlapped, in sequence, by the first gate electrode, and the first channel region of the semiconductor layer, in planar view.

16. The array substrate according to claim 1, wherein the light-shielding layer is overlapped, in sequence, by the first gate electrode, and the first lightly doped drain region of the semiconductor layer, in planar view.

17. The array substrate according to claim 1, wherein the second lightly doped drain region is adjacent to the first channel region, and
wherein the first gate electrode overlaps the first lightly doped drain region, the first channel region, the second lightly doped drain region, the boundary between first lightly doped drain region and the first channel region, and a boundary between the first channel region and the second lightly doped drain region, in planar view.

18. The array substrate according to claim 1, wherein the light-shielding layer partially overlaps the semiconductor layer which is a single layer, in such a manner that the light-shielding layer overlaps in planar view:
the boundary between the first channel region and the first lightly doped drain region,
the entire area of the first lightly doped drain region, and
the first impurity region coupled directly to the drain electrode.

19. The array substrate according to claim 1,
wherein the light-shielding layer overlaps the entire area of the first lightly doped drain region that is partially overlapped by the first gate electrode.

20. The array substrate according to claim 1,
wherein the second lightly doped drain region is adjacent to the first channel region, and
wherein part of the second lightly doped drain region is overlapped by the first gate electrode, in planar view.

21. A method for manufacturing an array substrate including a substrate having a first surface provided with, in sequence, a light-shielding layer, a first gate electrode, a semiconductor layer, a signal line that is in a same layer in which a drain electrode is disposed, and a pixel electrode in contact with the drain electrode, the method comprising:
providing the light-shielding layer having a first end and a second end opposite to the first end, on the first surface of the substrate;
providing the first gate electrode above the light-shielding layer such that the first end of the light-shielding layer overlaps the first gate electrode and the second end does not overlap the first gate electrode in planar view;
forming a resist layer on the semiconductor layer and performing back-surface exposure of exposing the resist layer from a side of a second surface opposite to the first surface of the substrate with the light-shielding layer and the first gate electrode, the first gate electrode having a part that overlaps the semiconductor layer without overlapping the light-shielding layer, functioning as a mask for the resist layer; and
performing front-surface exposure of exposing the resist layer from a side of the first surface of the substrate with a mask provided facing the resist layer,
wherein the semiconductor layer includes:
a first impurity region electrically coupled to the drain electrode;
a first channel region;
a second impurity region opposite to the first impurity region with respect to the first channel region,
a first lightly doped drain region provided adjacent to the first channel region, and
a second lightly doped drain region provided between the second impurity region and the first channel region, in planar view,
wherein the light-shielding layer overlaps in planar view:
a boundary between the first channel region and the first lightly doped drain region,
an entire area of the first lightly doped drain region, and
an entire area of the first impurity region that is electrically coupled to the drain electrode,
wherein the light-shielding layer does not overlap in planar view:
any part of the second lightly doped region, and
any part of the second impurity region opposite to the first impurity region,
wherein the first gate electrode overlaps the first channel region, the first lightly doped drain region, and the boundary between the first channel region and the first lightly doped drain region, in planar view, and
wherein the first gate electrode is disposed between the light-shielding layer and part of the semiconductor, the part including the first channel region and the first lightly doped drain region, in a vertical direction perpendicular to the substrate.

22. A display device comprising:
a substrate;
a light-shielding layer;
a first gate electrode;
a semiconductor layer;
a signal line;
a pixel electrode;
a common electrode;
a drain electrode in contact with the pixel electrode; and
a display functional layer,
wherein a first surface of the substrate is provided with, in sequence, the light-shielding layer, the first gate electrode, the semiconductor layer, the signal line that is in a same layer in which the drain electrode is disposed, the pixel electrode, and the display functional layer, and
the common electrode is opposed to the pixel electrode, wherein the semiconductor layer includes
- a first impurity region electrically coupled to the drain electrode,
- a first channel region,
- a second impurity region opposite to the first impurity region with respect to the first channel region,
- a first lightly doped drain region provided between the first impurity region and the first channel region, in planar view, and
- a second lightly doped drain region provided between the second impurity region and the first channel region, in planar view, wherein the light-shielding layer has a first end and a second end opposite to the first end, the first end being disposed at a position overlapping the first channel region, wherein the light-shielding layer overlaps in planar view:
- a boundary between the first channel region and the first lightly doped drain region,
- an entire area of the first lightly doped drain region, and
- an entire area of the first impurity region that is electrically coupled to the drain electrode, wherein the light-shielding layer does not overlap in planar view:
- any part of the second lightly doped region, and
- any part of the second impurity region opposite to the first impurity region, wherein the first gate electrode overlaps the first channel region, the first lightly doped drain region, and the boundary between the first channel region and the first lightly doped drain region, in planar view, and wherein the first gate electrode is disposed between the light-shielding layer and part of the semiconductor, the part including the first channel region and the first lightly doped drain region, in a vertical direction perpendicular to the substrate.

* * * * *